United States Patent
Park et al.

(10) Patent No.: US 11,991,897 B2
(45) Date of Patent: May 21, 2024

(54) DISPLAY APPARATUS WITH SPACED SHIELDING WALL PORTIONS WITHIN DISPLAY AREA AND PERIPHERAL AREA

(71) Applicant: Samsung Display Co., Ltd., Yongin-si (KR)

(72) Inventors: Kyunghae Park, Yongin-si (KR); Minhee Kim, Yongin-si (KR); Dokyung Youn, Yongin-si (KR); Minjae Kim, Yongin-si (KR); Taehoon Kim, Yongin-si (KR); Eunjeong Na, Yongin-si (KR); Joonhyung Park, Yongin-si (KR); Danbi Yang, Yongin-si (KR); Hanjun Yu, Yongin-si (KR); Simbum Yuk, Yongin-si (KR); Changhun Lee, Yongin-si (KR); Kangseob Jeong, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 325 days.

(21) Appl. No.: 17/336,828

(22) Filed: Jun. 2, 2021

(65) Prior Publication Data
US 2021/0384467 A1 Dec. 9, 2021

(30) Foreign Application Priority Data
Jun. 5, 2020 (KR) .......................... 10-2020-0068600

(51) Int. Cl.
*H10K 50/844* (2023.01)
*H10K 50/115* (2023.01)
(Continued)

(52) U.S. Cl.
CPC ......... *H10K 50/844* (2023.02); *H10K 50/115* (2023.02); *H10K 50/865* (2023.02); *H10K 59/38* (2023.02)

(58) Field of Classification Search
CPC .... H10K 50/844; H10K 50/865; H10K 59/38; H10K 50/115; H10K 59/88
See application file for complete search history.

(56) References Cited

U.S. PATENT DOCUMENTS

| 10,395,578 B2 | 8/2019 | Lee et al. |
| 10,551,656 B2 | 2/2020 | Kim et al. |

(Continued)

FOREIGN PATENT DOCUMENTS

| JP | 9-203803 | 8/1997 |
| JP | 2011-243526 | 12/2011 |

(Continued)

*Primary Examiner* — Nduka E Ojeh
(74) *Attorney, Agent, or Firm* — KILE PARK REED & HOUTTEMAN PLLC

(57) ABSTRACT

A display apparatus includes a substrate including a first area, and a second area adjacent to the first area; first to third light-emitting diodes that are arranged in the first area and include a color emission layer; an encapsulation layer overlapping the first to third light-emitting diodes, and including an inorganic layer and an organic layer; a first light shielding wall portion disposed on the encapsulation layer, the first light shielding wall portion including a 1-1-th opening portion, a 1-2-th opening portion, and a 1-3-th opening portion corresponding to the first to third light-emitting diodes, respectively; and a second light shielding wall portion disposed on the encapsulation layer and overlapping the second area. The first light shielding wall portion and the second light shielding wall portion are spaced apart from each other in a plan view.

21 Claims, 14 Drawing Sheets

(51) Int. Cl.
   *H10K 50/86*   (2023.01)
   *H10K 59/38*   (2023.01)

(56) References Cited

U.S. PATENT DOCUMENTS

| | | | |
|---|---|---|---|
| 10,707,275 | B2 | 7/2020 | Kim et al. |
| 2007/0157839 | A1 | 7/2007 | Kim et al. |
| 2010/0219429 | A1* | 9/2010 | Cok ............... H10K 50/865 |
| | | | 257/89 |
| 2012/0038267 | A1* | 2/2012 | Hanamura ......... H10K 59/38 |
| | | | 313/504 |
| 2012/0099061 | A1 | 4/2012 | Lee |
| 2016/0149165 | A1 | 5/2016 | Kim |
| 2017/0076678 | A1* | 3/2017 | Lee ................. G02F 1/1336 |
| 2017/0123317 | A1* | 5/2017 | Kamura ............... F21V 9/30 |
| 2019/0066545 | A1* | 2/2019 | Jung .................... G02B 5/201 |
| 2019/0079352 | A1* | 3/2019 | Park ............... G02F 1/133617 |
| 2019/0146290 | A1* | 5/2019 | Park ............... G02F 1/134309 |
| | | | 349/44 |
| 2020/0012036 | A1 | 1/2020 | Cho et al. |
| 2020/0152705 | A1 | 5/2020 | Son et al. |
| 2020/0402963 | A1* | 12/2020 | Lin .................... H01L 25/0753 |

FOREIGN PATENT DOCUMENTS

| | | |
|---|---|---|
| KR | 10-0790866 | 1/2008 |
| KR | 10-2009-0047687 | 5/2009 |
| KR | 10-2018-0057816 | 5/2018 |
| KR | 10-2018-0071657 | 6/2018 |
| KR | 10-2019-0055612 | 5/2019 |
| KR | 10-2020-0005257 | 1/2020 |

\* cited by examiner

DISPLAY APPARATUS WITH SPACED SHIELDING WALL PORTIONS WITHIN DISPLAY AREA AND PERIPHERAL AREA

CROSS-REFERENCE TO RELATED APPLICATION

This application is based on and claims priority under 35 U.S.C. § 119 to Korean Patent Application No. 10-2020-0068600, filed on Jun. 5, 2020, in the Korean Intellectual Property Office (KIPO), the contents of which are incorporated by reference herein in its entirety.

BACKGROUND

1. Technical Field

The disclosure relates to a display apparatus, and more specifically, to a display apparatus having improved display quality.

2. Description of Related Art

As various electronic apparatuses such as mobile phones, personal digital assistants (PDAs), computers, or large-sized televisions (TVs) have been developed, various types of display apparatuses that are applicable thereto have also been developed. For example, liquid crystal display apparatuses including a backlight unit and organic light-emitting display apparatuses that emit light of different colors in each color area have been widely used in the market. Recently, display apparatuses including a quantum dot color conversion layer (QD-CCL) have been developed.

SUMMARY

One or more embodiments include a display apparatus having improved image quality uniformity and improved display quality. However, this is merely an example, and the scope of the disclosure is not limited thereby.

Additional aspects will be set forth in part in the description and, in part, will be apparent from the description, or may be learned by practice of the presented embodiments of the disclosure.

According to one or more embodiments, a display apparatus may include a substrate including a first area, and a second area adjacent to the first area; a first light-emitting diode; a second light-emitting diode; a third light-emitting diode that are arranged in the first area of the substrate and include a color emission layer; an encapsulation layer overlapping the first light-emitting diode, the second light-emitting diode, and the third light-emitting diode, and including at least one inorganic layer and at least one organic layer; a first light shielding wall portion disposed on the encapsulation layer, the first light shielding wall portion including a 1-1-th opening portion, a 1-2-th opening portion, and a 1-3-th opening portion corresponding to the first light-emitting diode, the second light-emitting diode, and the third light-emitting diode, respectively; and a second light shielding wall portion disposed on the encapsulation layer and overlapping the second area of the substrate. The first light shielding wall portion and the second light shielding wall portion may be spaced apart from each other in a plan view.

According to the embodiment, the second light shielding wall portion may be arranged along an edge of the substrate.

According to the embodiment, the display apparatus may further include a first color conversion layer located in the 1-1-th opening portion, a second color conversion layer located in the 1-2-th opening portion, and a light transmission layer located in the 1-3-th opening portion.

According to the embodiment, the first color conversion layer, the second color conversion layer, and the light transmission layer may each include scattering particles, the first color conversion layer and the second color conversion layer may include a first quantum dot and a second quantum dot, respectively, and the first quantum dot and the second quantum dot may include a same material and have different sizes from each other.

According to the embodiment, the second light shielding wall portion may include a plurality of second opening portions.

According to the embodiment, the display apparatus may further include a first dummy color conversion layer; a second dummy color conversion layer; and a dummy light transmission layer. Each of the first dummy color conversion layer, the second dummy color conversion layer, and the dummy light transmission layer may be located in corresponding one of the plurality of second opening portions.

According to the embodiment, the display apparatus may further include a dummy light transmission layer located in the plurality of second opening portions.

According to the embodiment, the dummy light transmission layer and the light transmission layer may include a same material.

According to the embodiment, the first light shielding wall portion and the second light shielding wall portion may be integral with each other, and the second light shielding wall portion may include a plurality of second opening portions.

According to the embodiment, the display apparatus may further include a first color conversion layer located in the 1-1-th opening portion, a second color conversion layer located in the 1-2-th opening portion, a light transmission layer located in the 1-3-th opening portion, a first dummy color conversion layer, a second dummy color conversion layer, and a dummy light transmission layer. Each of the first dummy color conversion layer, the second dummy color conversion layer, and the dummy light transmission layer may be located in corresponding one of the plurality of second opening portions.

According to the embodiment, the display apparatus may further include a first color conversion layer located in the 1-1-th opening portion, a second color conversion layer located in the 1-2-th opening portion, a light transmission layer located in the 1-3-th opening portion, and a dummy light transmission layer located in the plurality of second opening portions.

According to the embodiment, the dummy light transmission layer and the light transmission layer may include a same material.

According to the embodiment, the display apparatus may further include a driver arranged in the second area of the substrate and providing electrical signals to the first, second, and third light-emitting diodes. At least a portion of the second light shielding wall portion may overlap the driver in a plan view.

According to the embodiment, the first light shielding wall portion and the second light shielding wall portion may include a same material.

According to the embodiment, the first light shielding wall portion and the second light shielding wall portion may each include a colored pigment or dye, and/or at least one metal oxide selected from titanium oxide, chromium oxide, and molybdenum oxide.

According to the embodiment, the first light shielding wall portion and the second light shielding wall portion may each have a thickness of about 8 μm to about 20 μm.

According to the embodiment, the first light shielding wall portion and the second light shielding wall portion may each include a first surface facing the substrate and a second surface opposite to the first surface, and the second surface may be hydrophobic.

According to one or more embodiments, a display apparatus may include a light-emitting unit including a display area from which light of a single color is emitted, and a peripheral area adjacent to the display area; and an optical unit that converts or transmits light emitted from the light-emitting unit into lights of different colors. The light-emitting unit may include pixel electrodes arranged in the display area; an opposite electrode disposed above the pixel electrodes; and an emission layer disposed between the pixel electrodes and the opposite electrode. The optical unit may include a first light shielding wall portion arranged in the display area, the first light shielding wall portion including a plurality of first opening portions corresponding to the pixel electrodes; a second light shielding wall portion arranged in the peripheral area and spaced apart from the first light shielding wall portion in a plan view; a first color conversion layer, a second color conversion layer, and a light transmission layer, each of the first color conversion layer, the second color conversion layer, and the light transmission layer being located in corresponding one of the plurality of first opening portions; a first capping layer overlapping the first light shielding wall portion; a first color filter layer, a second color filter layer, and a third color filter layer, the first color filter layer, the second color filter layer, the third color filter layer that are disposed on the capping layer and overlap the first color conversion layer, the second color conversion layer, and the light transmission layer, respectively.

According to the embodiment, the second light shielding wall portion may include a plurality of second opening portions spaced apart from each other. The display apparatus may further include a first dummy color conversion layer, a second dummy color conversion layer, and a dummy light transmission layer. Each of the first dummy color conversion layer, the second dummy color conversion layer, and the dummy light transmission layer may be located in corresponding one of the plurality of second opening portions.

According to the embodiment, the first light shielding wall portion and the second light shielding wall portion may be integral with each other and may include a same material.

Other aspects, features and advantages of the disclosure will become better understood through the accompanying drawings, the claims and the detailed description.

These general and specific aspects may be implemented by using a system, a method, a computer program, or any combinations thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
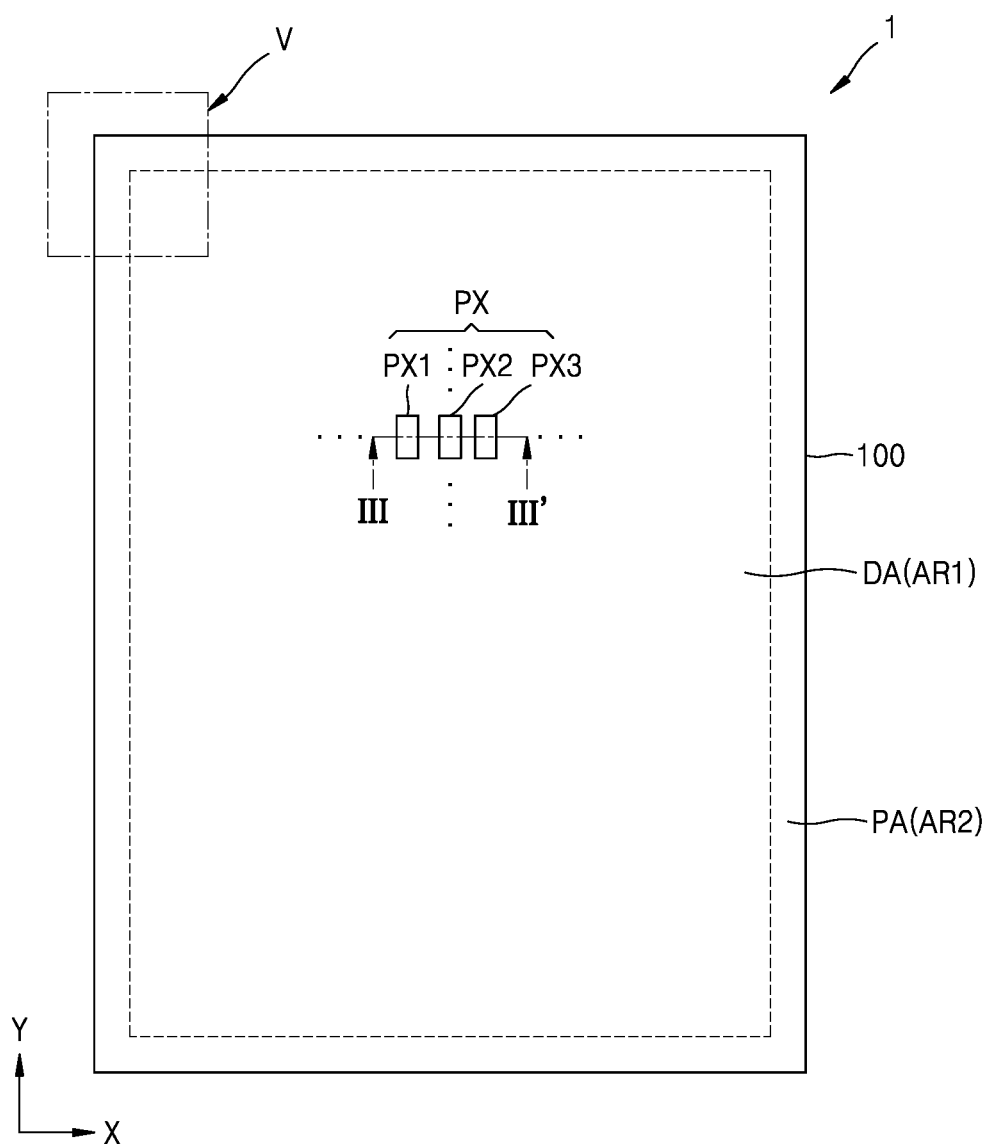
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b or c" or "at least one of a, b, and c" indicates only a, only b, only c, both a and b, both a and c, both b and c, all of a, b, and c, or variations thereof.

Because the disclosure may have diverse modified embodiments, preferred embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as being limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are omitted.

It will be understood that although the terms "first," "second," and the like may be used herein to describe various elements, these elements should not be limited by these terms. These terms are only used to distinguish one element from another.

An expression used in the singular encompasses the expression of the plural, unless it has a clearly different meaning in the context.

It will be further understood that the terms "comprises" and "comprising" used herein specify the presence of stated features or elements but do not preclude the presence or addition of one or more other features or elements.

It will be understood that when a layer, region, or element is referred to as being formed or disposed "on" another layer, area, or element, it can be directly or indirectly formed on the other layer, region, or element. For example, intervening layers, regions, or elements may be present.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the following embodiments, it will be understood that when a layer, region, or component is referred to as being "connected to" or "coupled to" another layer, region, and component, it may be directly or indirectly connected or coupled to the other layer, region, or component. For example, intervening layers, regions, or components may be present. In the following embodiments, it will be understood that when a layer, region, or element is referred to as being "electrically connected to" or "electrically coupled to" another layer, region, and element, it may be directly or indirectly electrically connected or coupled to the other layer, region, or element. For example, intervening layers, regions, or elements may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic plan view of a display apparatus 1 according to an embodiment.

Referring to FIG. 1, the display apparatus 1 may include a display area DA, and a peripheral area PA located outside or adjacent to the display area DA. The display apparatus 1 may provide an image through an array of pixels PX arranged two-dimensionally in the display area DA. The pixels PX may include a first pixel PX1, a second pixel PX2, and a third pixel PX3. The peripheral area PA is an area that does not provide an image and may completely or partially surround the display area DA. A driver or the like that provides an electrical signal or power to a pixel circuit corresponding to each of the pixels PX may be arranged in the peripheral area PA. A pad to which an electronic element, a printed circuit board, or the like may be electrically connected may be arranged in the peripheral area PA. For example, a bezel may be arranged in the peripheral area PA.

The display apparatus 1 may include a substrate 100. Elements included in the display apparatus 1, for example, light-emitting diodes, pixel circuits, wirings, drivers, electronic devices, and the like, may be arranged on the substrate 100. The substrate 100 may include a first area AR1 and a second area AR2. A light-emitting diode may be arranged on the first area AR1. The first area AR1 may correspond to the display area DA in which an image is implemented by light emitted by the light-emitting diode. No light-emitting diode may be arranged on the second area AR2. Even in case that a light-emitting diode is arranged, the light-emitting diode may not be driven by a pixel circuit. Therefore, the second area AR2 may correspond to the peripheral area PA that does not provide an image.

Although a case in which the display apparatus 1 includes an organic light-emitting diode OLED as a light-emitting diode will be described below, the display apparatus 1 according to the disclosure is not limited thereto. In another embodiment, the display apparatus 1 may include an inorganic light-emitting display or an inorganic electroluminescence (EL) display including an inorganic material, such as a micro light-emitting diode, or a quantum dot light-emitting display. For example, an emission layer of a light-emitting diode provided in the display apparatus 1 may include an organic material, an inorganic material, a quantum dot, an organic material and a quantum dot, or an inorganic material and a quantum dot.

Figure 2:
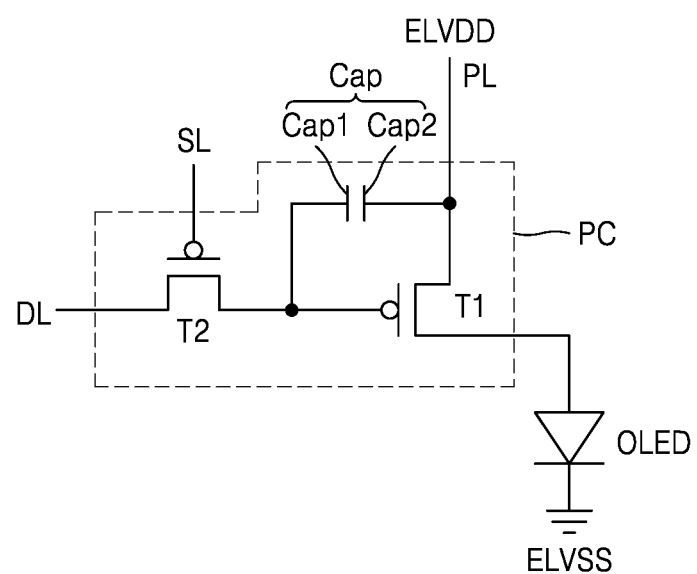
FIG. 2 is a schematic equivalent circuit diagram of a pixel circuit of a pixel included in a display apparatus, according to an embodiment.

FIG. 2 is an equivalent circuit diagram of a pixel circuit of a pixel included in a display apparatus, according to an embodiment.

Referring to FIG. 2, the display apparatus (1 in FIG. 1) may include a light-emitting diode and a pixel circuit PC. For example, the light-emitting diode may include, for example, an organic light-emitting diode OLED. The organic light-emitting diode OLED may be electrically connected to the pixel circuit PC, may receive a driving voltage through the pixel circuit PC and, may emit light. The light-emitting diode emits light through an emission area. The emission area may be defined as a pixel (PX in FIG. 1).

The pixel circuit PC may include thin-film transistors and a storage capacitor. In an embodiment, the pixel circuit PC may include a first thin-film transistor T1, a second thin-film transistor T2, and a storage capacitor Cap.

The second thin-film transistor T2 is a switching thin-film transistor that may be electrically connected to a scan line SL and a data line DL and may be configured to transfer, to the first thin-film transistor T1, a data voltage (or a data signal) input from the data line DL based on a switching voltage (or a switching signal) input from the scan line SL.

The storage capacitor Cap may be electrically connected to the second thin-film transistor T2 and a driving voltage line PL and may be configured to store a voltage corresponding to a difference between a voltage received from the second thin-film transistor T2 and a first power supply voltage ELVDD supplied to the driving voltage line PL. The storage capacitor Cap may include at least a first storage plate Cap1 and a second storage plate Cap2.

The first thin-film transistor T1 is a driving thin-film transistor that may be electrically connected to the driving voltage line PL and the storage capacitor Cap and may be configured to control a driving current flowing from the driving voltage line PL to the organic light-emitting diode OLED according to a voltage value stored in the storage capacitor Cap. The organic light-emitting diode OLED may emit light having a certain luminance according to the driving current. An opposite electrode (e.g., a cathode) of the organic light-emitting diode OLED may be configured to receive a second power supply voltage ELVSS.

A case in which the pixel circuit PC includes two thin-film transistors and one storage capacitor has been described with reference to FIG. 2, but the disclosure is not limited thereto. For example, the pixel circuit PC may include three or more thin-film transistors and/or two or more storage capacitors. In an embodiment, the pixel circuit PC may include seven thin-film transistors and one storage capacitor. The number of thin-film transistors and the number of storage capacitors may be variously changed according to the design of the pixel circuit PC. For convenience of explanation, a case in which the pixel circuit PC includes two thin-film transistors and one storage capacitor will be described below.

Figure 3:
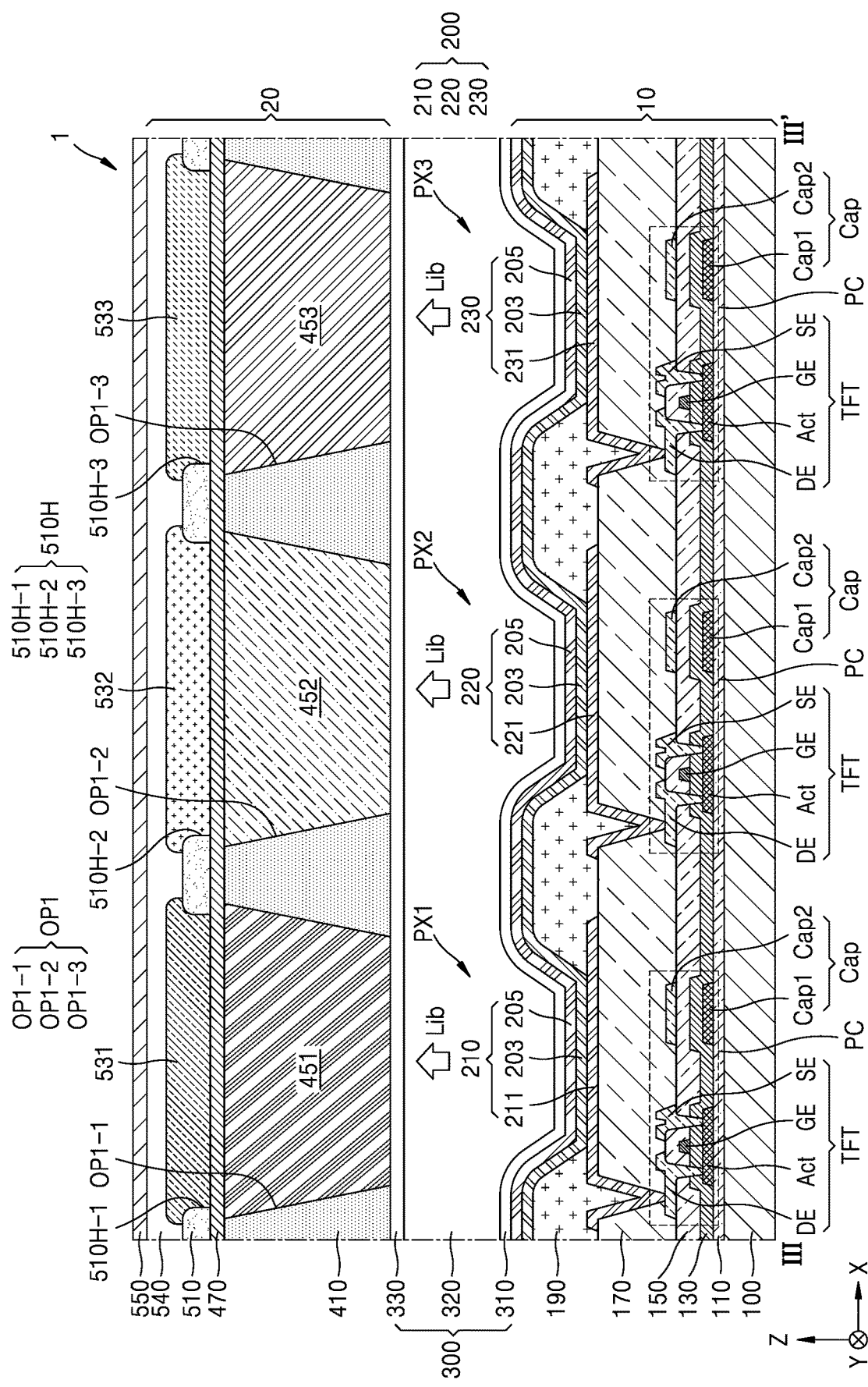
FIG. 3 is a cross-sectional view schematically illustrating a portion of the display apparatus of FIG. 1.

FIG. 3 is a cross-sectional view schematically illustrating a portion of the display apparatus 1 of FIG. 1 and may correspond to a cross-section taken along line III-III' of FIG. 1.

Referring to FIG. 3, the display apparatus 1 may include pixels PX. The pixels PX may include, for example, first to third pixels PX1 to PX3. Although FIG. 3 illustrates that the first to third pixels PX1 to PX3 are adjacent to each other, the disclosure is not limited thereto. Elements such as other pixels or wirings may be between the first to third pixels PX1 to PX3. Therefore, for example, the first pixel PX1 and the second pixel PX2 may not be located adjacent to each other. Also, the cross-sections of the first to third pixels PX1 to PX3 in FIG. 3 may not be cross-sections taken in the same direction.

The display apparatus 1 according to the embodiment may include a substrate 100. The substrate 100 may include glass, metal, or polymer resin. In case that the substrate 100 is flexible or bendable, the substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. For example, the substrate 100 may have a multi-layered structure that includes two layers each including the aforementioned polymer resin, and a barrier layer between the two layers, the barrier layer including an inorganic material. The barrier layer may include, for example, an inorganic material, such as silicon oxide, silicon nitride, or silicon oxynitride.

Light-emitting diodes 200 may be located on the substrate 100. FIG. 3 illustrates that a first light-emitting diode 210, a second light-emitting diode 220, and a third light-emitting diode 230 are located. In addition to the light-emitting diodes 200, thin-film transistors TFT and storage capacitors Cap, which are electrically connected to the light-emitting diodes 200, may be located on the substrate 100. For example, pixel circuits PC each including the thin-film transistors TFTs and the storage capacitor Cap may be located on the substrate 100. FIG. 3 illustrates that organic light-emitting diodes are located on the substrate 100 as the light-emitting diodes. The electrical connection of the organic light-emitting diodes to the thin-film transistors TFT may be understood as electrical connection of pixel electrodes 211, 221, and 231 to the thin-film transistors TFT.

The thin-film transistor TFT may include a semiconductor layer Act, a gate electrode GE overlapping a channel region of the semiconductor layer Act, and a source electrode SE and a drain electrode DE respectively connected to a source region and a drain region of the semiconductor layer Act.

The semiconductor layer Act may include polysilicon. In some embodiments, the semiconductor layer Act may include amorphous silicon. In some embodiments, the semiconductor layer Act may include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer Act may include a channel region, and a source region and a drain region doped with impurities.

The gate electrode GE may include a low-resistance conductive material such as molybdenum (Mo), aluminum (Al), copper (Cu), and/or titanium (Ti), and may include a single-layered structure or a multi-layered structure including the aforementioned materials.

The source electrode SE or the drain electrode DE may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may have a single layer or a multi-layer including the aforementioned materials. For example, the source electrode SE or the drain electrode DE may have a three-layer structure of a titanium layer/aluminum layer/titanium layer.

The storage capacitor Cap may include a first storage plate Cap1 and a second storage plate Cap2 overlapping each other. The first storage plate Cap1 and the gate electrode GE may be arranged on the same layer and may include the same material. The second storage plate Cap2 and the source electrode SE or the drain electrode DE may be arranged on the same layer and may include the same material. An insulating layer may be between the first storage plate Cap1 and the second storage plate Cap2 of the storage capacitor Cap. The first storage plate Cap1 and the second storage plate Cap2 overlap each other to form a capacitor. In this case, the insulating layer may function as a dielectric layer of the storage capacitor Cap.

Although FIG. 3 illustrates that the gate electrode GE of the thin-film transistor TFT and the first storage plate Cap1 of the storage capacitor Cap are spaced apart from each other, the storage capacitor Cap may overlap the thin-film transistor TFT. In this case, the gate electrode GE of the thin-film transistor TFT may function as the first storage plate Cap1 of the storage capacitor Cap.

A buffer layer 110 may be disposed between the substrate 100 and the semiconductor layer Act. The buffer layer 110 may reduce or block penetration of foreign matter, moisture, or external air from the bottom of the substrate 100 and may provide a flat surface on the substrate 100. The buffer layer 110 may include an inorganic insulating material such as silicon oxide, silicon oxynitride, and silicon nitride, and may have a single-layered structure or a multi-layered structure including the aforementioned materials.

In order to secure an electrical insulation between the semiconductor layer Act and the gate electrode GE, a gate insulating film 130 may be disposed between the semiconductor layer Act and the gate electrode GE. The gate insulating film 130 may include an inorganic material such as silicon oxide, silicon nitride, and/or silicon oxynitride.

An interlayer insulating layer 150 may be arranged above the gate electrode GE and the first storage plate Cap1. The interlayer insulating layer 150 may include an inorganic material such as silicon oxide, silicon nitride, and/or silicon oxynitride. The source electrode SE, the drain electrode DE, and the second storage plate Cap2 may be arranged above the interlayer insulating layer 150. The interlayer insulating layer 150 including such an inorganic material may be formed by chemical vapor deposition (CVD) or atomic layer deposition (ALD). The same will apply to the following embodiments and modifications thereof.

A planarization layer 170 may be arranged on the thin-film transistor TFT. For example, in case that the organic light-emitting device is arranged above the thin-film transistor TFT as illustrated in FIG. 3, the planarization layer 170 may roughly planarize a protective layer covering the thin-film transistor TFT. The planarization layer 170 may include, for example, an organic material such as acryl, benzocyclobutene (BCB), or hexamethyldisiloxane (HMDSO). Although FIG. 3 illustrates that the planarization layer 170 has a single-layered structure, various modifications may be made thereto. For example, the planarization layer 170 may have a multi-layered structure.

First to third light-emitting diodes 210, 220, and 230 may be arranged on the planarization layer 170. In an embodiment, the first to third light-emitting diodes 210, 220, and 230 may have the same structure. Hereinafter, for convenience of explanation, the first light-emitting diode 210 will be described.

A stacked structure of a first pixel electrode 211, an intermediate layer 203, and an opposite electrode 205 may form the first light-emitting diode 210. An organic light-emitting diode may be used as the light-emitting diode. The organic light-emitting diode may emit light of a first color. An emission area of the organic light-emitting diode corresponds to a pixel PX.

Specifically, the first light-emitting diode 210 may include, for example, the first pixel electrode 211, the opposite electrode 205, and the intermediate layer 203 between therebetween. The intermediate layer 203 may include an emission layer. The first pixel electrode 211 may be in electrical contact with one of the source electrode SE and the drain electrode DE via a contact hole formed in the planarization layer 170 or the like, such that the first pixel electrode 211 is electrically connected to the thin-film transistor TFT. The first pixel electrode 211 includes a transmissive conductive layer including a transmissive conductive oxide, such as indium tin oxide (ITO), $In_2O_3$, or indium zinc oxide (IZO), and a reflective layer including a metal such as Al or Ag. For example, the first to third pixel electrodes 211 to 231 may each have a three-layer structure of ITO/Ag/ITO.

The intermediate layer 203 including the emission layer may be integrally formed over the pixel electrodes, and the opposite electrode 205 on the intermediate layer 203 may also be integrally formed over the pixel electrodes. The opposite electrode 205 may include a transmissive conductive layer including ITO, $In_2O_3$, or IZO and may also include a semi-transmissive layer including a metal such as Al or Ag. For example, the opposite electrode 205 may include a semi-transmissive layer including MgAg.

A pixel defining layer 190 may be arranged above the planarization layer 170. The pixel defining layer 190 may define pixels by including openings corresponding to the respective pixels, for example, openings exposing at least central portions of the first to third pixel electrodes 211, 221, and 231. Also, the pixel defining layer 190 may increase a distance between the edge of each of the first to third pixel electrodes 211, 221, and 231 and the opposite electrode 205, thereby preventing formation of arcs at the edge of the third pixel electrode 231. The pixel defining layer 190 may include an organic material such as polyimide or hexamethyldisiloxane (HMDSO).

The intermediate layer 203 may include a low molecular weight material or a high molecular weight material. In case that the intermediate layer 203 includes a low molecular weight material, the intermediate layer 203 may have a structure in which a hole injection layer (HIL), a hole transport layer (HTL), an emission layer (EML), an electron transport layer (ETL), and an electron injection layer (EIL) are stacked in a single or multiple structure. The intermediate layer 203 may be formed by vacuum deposition. In case that the intermediate layer 203 includes a high molecular weight material, the intermediate layer 203 may have a structure including an HTL and an EML. In this case, the HTL may include poly(3,4-ethylenedioxythiophene) (PEDOT), and the EML may include a poly-phenylenevinylene (PPV)-based polymer or a polyfluorene-based polymer. The intermediate layer 203 may be formed by screen printing, inkjet printing, deposition, or laser induced thermal image (LITI). The intermediate layer 203 is not necessarily limited thereto. The intermediate layer 203 may have various structures.

The intermediate layers 203 may include the layer integrally formed over the first to third pixel electrodes 211, 221, and 231 as described above, but in some cases, the intermediate layers 203 may include layers patterned to correspond to the first to third pixel electrodes 211, 221, and 231, respectively. In any case, the intermediate layer 203 includes a first color emission layer. The first color emission layers may be integrally formed over the first to third pixel electrodes 211, 221, and 231, but in some cases, the first color emission layers may be patterned to correspond to the first to third pixel electrodes 211, 221, and 231, respectively. The first color emission layer may emit light having a wavelength of, for example, about 450 nm to about 495 nm.

The opposite electrodes 205 may be located on the intermediate layers 203 to correspond to the first to third pixel electrodes 211, 221, and 231, respectively. The opposite electrodes 205 may be integrally formed with respect to organic light-emitting diodes.

The organic light-emitting diodes may be easily damaged by external moisture or oxygen. Accordingly, an encapsulation layer 300 may cover or overlap the organic light-emitting diodes so as to protect the organic light-emitting diodes.

The encapsulation layer 300 may be arranged on the opposite electrode 205. The first to third light-emitting diodes 210, 220, and 230 may be covered by the encapsulation layer 300. The encapsulation layer 300 may include first and second inorganic encapsulation layers 310 and 330, and an organic encapsulation layer 320 therebetween.

The first and second inorganic encapsulation layers 310 and 330 may each include one or more inorganic insulating materials. The one or more inorganic insulating materials may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed by chemical vapor deposition.

The organic encapsulation layer 320 may include a polymer-based material. Examples of the polymer-based material may include an acrylic resin, an epoxy resin, polyimide, and/or polyethylene. For example, the organic encapsulation layer 320 may include an acrylic resin, for example, polymethyl methacrylate, polyacrylic acid, or the like. The organic encapsulation layer 320 may be formed by curing a monomer or applying a polymer.

A structure stacked from the substrate 100 to the first to third light-emitting diodes 210, 220, and 230 may be referred to as a light-emitting unit 10. The light-emitting unit 10 may generate incident light Lib incident onto a first color conversion layer 451, a second color conversion layer 452, and a light transmission layer 453, which will be described below, and the incident light Lib emitted from the light-emitting unit 10 may travel to the first color conversion layer 451, the second color conversion layer 452, and the light transmission layer 453 through the encapsulation layer 300.

The display apparatus 1 according to the embodiment may include a first light shielding wall portion 410, a first color conversion layer 451, a second color conversion layer 452, a light transmission layer 453, a first capping layer 470, a light shielding layer 510, a first color filter layer 531, a second color filter layer 532, a third color filter layer 533, and a second capping layer 550.

The first light shielding wall portion 410 may include a first opening portion OP1 corresponding to the light-emitting diode. For example, the first light shielding wall portion 410 may include a 1-1-th opening portion OP1-1, a 1-2-th opening portion OP1-2, and a 1-3-th opening portion OP1-3 corresponding to the first light-emitting diode 210, the second light-emitting diode 220, and the third light-emitting diode 230, respectively.

The first light shielding wall portion 410 may have various colors including black, white, red, purple, and blue. The first light shielding wall portion 410 may include a colored pigment or dye. The first light shielding wall portion 410 may include a light shielding material. The light shielding material may include an opaque inorganic insulating material including a metal oxide such as titanium oxide ($TiO_2$), chromium oxide ($Cr_2O_3$), or molybdenum oxide ($MoO_3$), or may include an opaque organic insulating material such as black resin. In another example, the first light shielding wall portion 410 may include an organic insulating material such as white resin.

As described below, the first light shielding wall portion 410 may prevent a color mixture between lights converted or transmitted by the first color conversion layer 451, the second color conversion layer 452, and the light transmission layer 453, which are adjacent to each other.

The first color conversion layer 451, the second color conversion layer 452, and the light transmission layer 453 may be located in the 1-1-th opening portion OP1-1, the 1-2-th opening portion OP1-2, and the 1-3-th opening portion OP1-3, respectively, and may correspond to the first light-emitting diode 210, the second light-emitting diode 220, and the third light-emitting diode 230, respectively. The first color conversion layer 451, the second color conversion layer 452, and the light transmission layer 453 may be spaced apart from each other at regular intervals, and the first light shielding wall portion 410 may be located therebetween.

The first color conversion layer 451, the second color conversion layer 452, and the light transmission layer 453 may convert or transmit incident light Lib generated by the light-emitting unit 10 into light of a specific color and may emit the light toward the first to third color filter layers 531, 532, and 533, respectively. The light converted or transmitted by the first color conversion layer 451, the second color conversion layer 452, and the light transmission layer 453 may be one of red light, green light, and blue light.

For example, the incident light Lib may be blue light having a wavelength band in a range of about 400 nm to about 495 nm, and the light emitted through the first to third color filter layers 531, 532, and 533 may include red light having a wavelength band in a range of about 580 nm to about 750 nm, green light having a wavelength band in a range of about 495 nm to about 580 nm, and blue light having a wavelength band in a range of about 400 nm to about 495 nm.

The incident light Lib may be converted into red light through the first color conversion layer 451 and may be emitted toward the first color filter layer 531, and the light passing through the first color filter layer 531 may be emitted to the outside. The incident light Lib may be converted into green light through the second color conversion layer 452 and may be emitted toward the second color filter layer 532, and the light passing through the second color filter layer 532 may be emitted to the outside. The incident light Lib may be transmitted through the light transmission layer 453 without color conversion and may be emitted toward the third color filter layer 533, and the light passing through the third color filter layer 533 may be emitted to the outside. Therefore, the incident light Lib emitted from the light-emitting unit 10 is converted or transmitted into green light, red light, and blue light while passing through the first color conversion layer 451, the second color conversion layer 452, and the light transmission layer 453, respectively, thereby displaying a color image.

The first capping layer 470 may be arranged on the first color conversion layer 451, the second color conversion layer 452, and the light transmission layer 453. The first capping layer 470 may overlap (or cover) the first color conversion layer 451, the second color conversion layer 452, and the light transmission layer 453. The first capping layer 470 may include an inorganic insulating material such as silicon nitride, silicon oxide, or silicon oxynitride.

The first capping layer 470 and the encapsulation layer 300 may be arranged such that the first color conversion layer 451, the second color conversion layer 452, and the light transmission layer 453 are disposed between the first capping layer 470 and the encapsulation layer 300. The first and second color conversion layers 451 and 452 may include quantum dots, as described below with reference to FIG. 4. Because the quantum dots include nanoparticles, the quantum dots may deteriorate due to the reaction with moisture, oxygen, or the like. Therefore, the first capping layer 470 and the encapsulation layer 300 may overlap or cover the first and second color conversion layers 451 and 452 above and under the first and second color conversion layers 451 and 452 so as to prevent moisture, oxygen, or the like from being introduced into the quantum dots in the first and second color conversion layers 451 and 452.

The light shielding layer 510 may be arranged on the first capping layer 470. The light shielding layer 510 may include holes 510H respectively overlapping the first opening portions OP1. The light shielding layer 510 may include a light shielding material. The light shielding material may include an opaque inorganic insulating material including a metal oxide such as titanium oxide ($TiO_2$), chromium oxide ($Cr_2O_3$), or molybdenum oxide ($MoO_3$), or may include an opaque organic insulating material such as black resin. The light shielding layer 510 may block light from being emitted to the outside of the emission area, thereby preventing light leakage from occurring in the display apparatus 1.

The first to third color filter layers 531, 532, and 533 may be located in holes 510H of the light shielding layer 510, respectively. For example, the first color filter layer 531 may be located in a first hole 510H-1 corresponding to the first light-emitting diode 210, the second color filter layer 532 may be located in a second hole 510H-2 corresponding to the second light-emitting diode 220, and the third color filter layer 533 may be located in a third hole 510H-3 corresponding to the third light-emitting diode 230. As another example, a portion of each of the first to third color filter layers 531, 532, and 533 may be arranged on the light shielding layer 510.

The first to third color filter layers 531, 532, and 533 may each include an organic pattern including a dye or pigment. The first to third color filter layers 531, 532, and 533 may include pigments or dyes of different colors, respectively, and selectively transmit only light of the corresponding color. For example, the first color filter layer 531 may include a red pigment or dye and selectively transmit only red light, the second color filter layer 532 may include a green pigment or dye and selectively transmits only green light, and the third color filter layer 533 may include a blue pigment or dye and selectively transmit only blue light.

To adjust the amount of each color light emitted from the display apparatus 1, for example, the third color filter layer 533 may be thicker than the first color filter layer 531 and the second color filter layer 532.

As a further example, the light shielding layer 510 and the third color filter layer 533 may include the same material and may be formed by the same process. In this case, the first color filter layer 531 may be located in the first hole 510H-1 at a position corresponding to the first light-emitting diode 210, the second color filter layer 532 may be located in the second hole 510H-2 at a position corresponding to the second light-emitting diode 220, the third hole 510H-3 is not formed at a position corresponding to the third light-emitting diode 230, and a portion of the light shielding layer 510 may function as the third color filter layer 533. A portion of the light shielding layer 510 between the first color filter layer 531 and the second color filter layer 532 may prevent color mixing from occurring between lights converted by the first color conversion layer 451 and second color conversion layer 452 that are adjacent to each other.

A filler 540 may be arranged on the light shielding layer 510 and may cover or overlap the first to third color filter layers 531, 532, and 533. The filler 540 may buffer an external pressure or the like and may provide a flat upper surface. The filler 540 may include an organic material such as an acrylic resin, an epoxy resin, polyimide, or polyethylene.

A second capping layer 550 may be arranged on the filler 540. The second capping layer 550 may include an inorganic insulating material such as silicon nitride, silicon oxide, or silicon oxynitride.

Light emitted from the light-emitting unit 10 is not able to be transmitted through the light shielding materials of the first light shielding wall portion 410 and the light shielding layer 510, and is able to be transmitted through only an area where the first opening portion OP1 of the first light shielding wall portion 410 overlaps the hole 510H of the light shielding layer 510. Therefore, the area where the first opening portion OP1 overlaps the hole 510H may be defined as an emission area, and the area where the light shielding materials of the first light shielding wall portion 410 and the light shielding layer 510 are located may be defined as a non-emission area.

The case in which the light-emitting unit 10 and the optical unit 20 of the display apparatus 1 are formed on one substrate has been described. However, in another embodiment, a display apparatus 1 may be manufactured by forming a light-emitting unit 10 and an encapsulation layer 300 on a lower substrate, forming an optical unit 20 on an upper substrate, and bonding the lower substrate and the upper substrate to each other.

Figure 4:
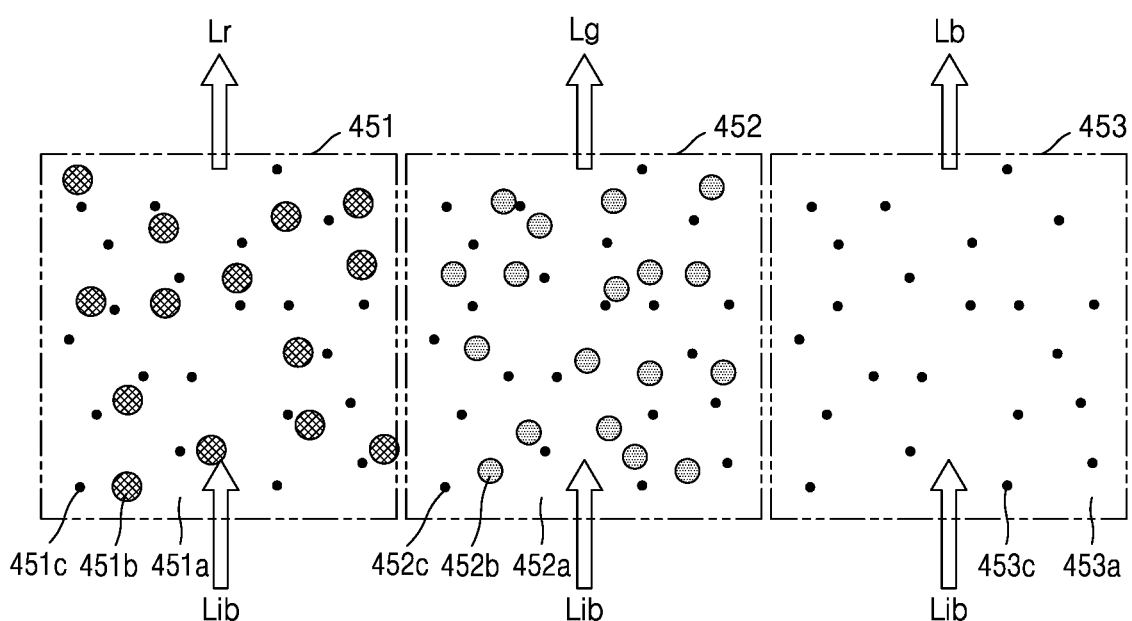
FIG. 4 is a cross-sectional view schematically illustrating a portion of a display apparatus, according to an embodiment.

FIG. 4 is a cross-sectional view schematically illustrating a portion of a display apparatus 1, according to an embodiment.

Referring to FIG. 4, the display apparatus 1 according to the embodiment may include a first color conversion layer 451, a second color conversion layer 452, and a light transmission layer 453.

For example, the first color conversion layer 451 may convert blue incident light Lib into red light Lr. To this end, the first color conversion layer 451 may include a first photosensitive polymer 451a in which first quantum dots 451b are dispersed.

The first photosensitive polymer 451a may include an organic material having light transmission properties, such as a silicone resin or an epoxy resin.

The first quantum dots 451b may be excited by the blue incident light Lib to isotropically emit the red light Lr having a wavelength longer than that of blue light. The first quantum dots 451b may include Group II-VI compounds, Group III-V compounds, Group IV-VI compounds, Group IV compounds, or any combinations thereof.

First scattering particles 451c may be further dispersed in the first photosensitive polymer 451a. The first scattering particles 451c may allow more first quantum dots 451b to be excited by scattering the blue incident light Lib that is not absorbed by the first quantum dots 451b. Therefore, the color conversion efficiency of the first color conversion layer 451 may be increased. The first scattering particles 451c may include, for example, titanium oxide ($TiO_2$) or metal particles.

For example, the second color conversion layer 452 may convert the blue incident light Lib into green light Lg. The second color conversion layer 452 may include a second photosensitive polymer 452a in which second quantum dots 452b are dispersed. In the second photosensitive polymer 452a, the second scattering particles 452c are dispersed together with the second quantum dots 452b. Therefore, the color conversion rate of the second color conversion layer 452 may be increased.

The second photosensitive polymer 452a and the first photosensitive polymer 451a may include the same material, and the second scattering particles 452c and the first scattering particles 451c may include the same material. The second quantum dots 452b may include Group II-VI compounds, Group III-V compounds, Group IV-VI compounds, Group IV compounds, or any combinations thereof. For example, the second quantum dots 452b and the first quantum dots 451b may include the same material. However, the size of the second quantum dots 452b may be less than the size of the first quantum dots 451b. Therefore, the second quantum dots 452b may be excited by the blue incident light Lib to isotropically emit the green light Lg having a wavelength longer than that of the blue light and shorter than that of the red light Lr.

The light transmission layer 453 may include a third photosensitive polymer 453a in which the third scattering particles 453c are dispersed. For example, the light transmission layer 453 does not include separate quantum dots that may be excited by the blue incident light Lib. Similarly to the first photosensitive polymer 451a, the third photosensitive polymer 453a may include an organic material having light transmission properties, and the third scattering particles 453c and the first scattering particles 451c may include the same material. Because the blue incident light Lib incident onto the light transmission layer 453 may be transmitted through the light transmission layer 453 without color change, the light emitted through the light transmission layer 453 may be the blue light Lb. However, the blue incident light Lib may be scattered by the third scattering particles 453c in the light transmission layer 453 and may be emitted to the outside. Because the light transmission layer 453 transmits the blue incident light Lib without color change, thereby obtaining higher light efficiency.

Figure 5:
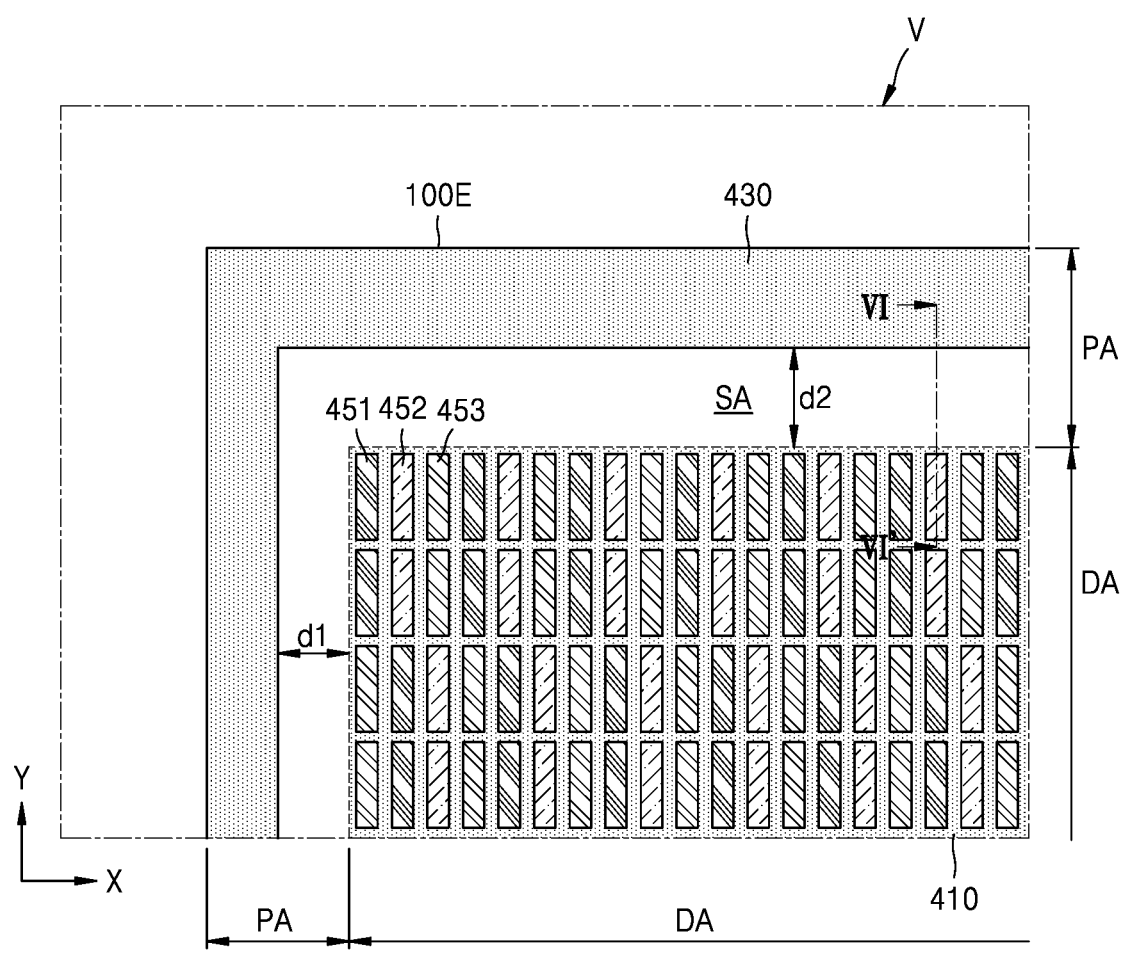
FIG. 5 is an enlarged plan view schematically illustrating a portion of a display apparatus, according to an embodiment.

FIG. 5 is an enlarged plan view schematically illustrating a portion of a display apparatus 1, according to an embodiment. FIG. 5 illustrates an area corresponding to portion V of FIG. 1, and the arrangement of a first light shielding wall portion, a second light shielding wall portion, a first color conversion layer, a second color conversion layer, and a light transmission layer. FIG. 5 may be understood as a state when seen from above a substrate in a direction perpendicular to the substrate.

Referring to FIG. 5, the display apparatus 1 may include a first light shielding wall portion 410 arranged in a display area DA, and a second light shielding wall portion 430 arranged in a peripheral area PA. The first light shielding wall portion 410 may be arranged to overlap a first area AR1 of a substrate 100 corresponding to the display area DA, and the second light shielding wall portion 430 may be arranged to overlap a second area AR2 of the substrate 100 corresponding to the peripheral area PA.

The first light shielding wall portion 410 may include first opening portions OP1. The first opening portions OP1 may have a rectangular shape on a plane, but the disclosure is not limited thereto. The first opening portions OP1 may have a triangular shape, a rectangular shape, a rhombus shape, a polygonal shape, a circular shape, an elliptical shape, or the like. The plane may be a virtual plane parallel to one surface of the substrate 100, or a plane when seen in a direction perpendicular to the substrate 100. In the following description, the expression "on a plane" may mean "on a virtual plane parallel to one surface of the substrate" unless otherwise specified.

The first opening portions OP1 may be arranged in the x-direction and the y-direction intersecting the x-direction, but the disclosure is not limited thereto. The shape and arrangement of the first opening portions OP1 may correspond to the shape and arrangement of pixels PX. In case that the pixels PX are arranged in a pattern, such as a stripe pattern, an s-stripe pattern, or a PenTile® pattern, the first opening portions OP1 may also be arranged in the corresponding pattern.

A first color conversion layer 451, a second color conversion layer 452, and a light transmission layer 453 may be arranged in the first opening portions OP1 of the first light shielding wall portion 410. The first color conversion layer 451, the second color conversion layer 452, and the light transmission layer 453 may be spaced apart from each other on a plane, and a distance between the first color conversion layer 451 and the second color conversion layer 452 or a distance between the second color conversion layer 452 and the light transmission layer 453 may be substantially equal to the width of the first light shielding wall portion 410. The first color conversion layer 451, the second color conversion layer 452, and the light transmission layer 453 may be arranged with a certain rule or pattern in one direction.

The second light shielding wall portion 430 may be spaced apart from the first light shielding wall portion 410 on a plane and may be arranged along an edge 100E of the substrate 100. A separation area SA between the first light shielding wall portion 410 and the second light shielding wall portion 430 may overlap the peripheral area PA or may be adjacent to the display area DA. A first separation distance d1 between the first light shielding wall portion 410 and the second light shielding wall portion 430 in the x-direction may be different from or substantially equal to a second separation distance d2 between the first light shielding wall portion 410 and the second light shielding wall portion 430 in the y-direction.

Figure 6:
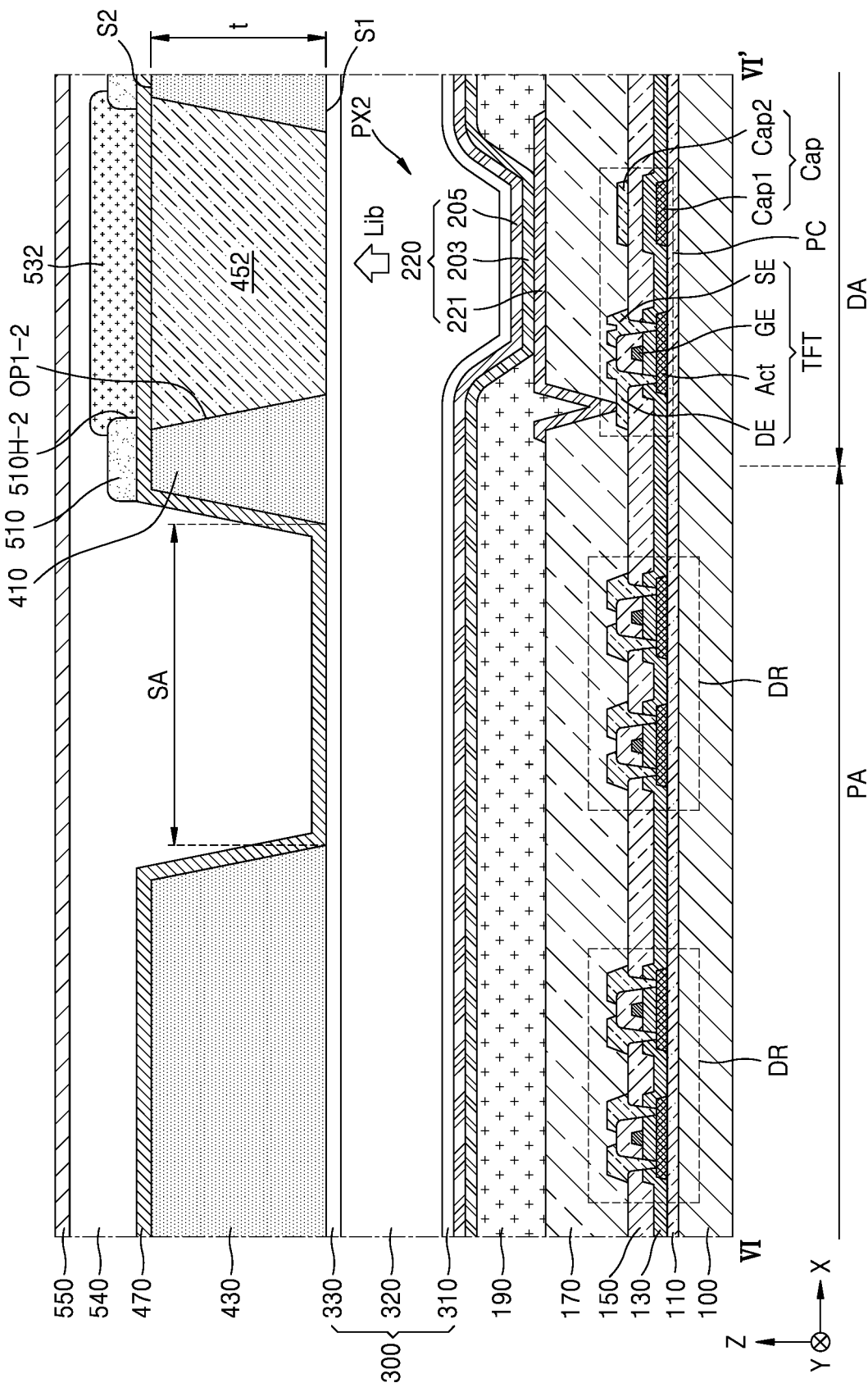
FIG. 6 is a cross-sectional view schematically illustrating a portion of the display apparatus of FIG. 5.

FIG. 6 is a cross-sectional view schematically illustrating a portion of the display apparatus of FIG. 5, and may correspond to a cross-section taken along line VI-VI' of FIG. 5. The same reference numerals are assigned to elements that are identical to or corresponding to the elements described above with reference to FIG. 3, and a redundant description thereof will be omitted.

A driver DR that provides an electrical signal to first to third light-emitting diodes 210, 220, and 230 may be arranged on the substrate 100. The driver DR may be arranged in the peripheral area PA and may overlap at least a portion of the second light shielding wall portion 430 when seen in a direction perpendicular to the substrate 100.

A buffer layer 110 and insulating layers 130, 150, and 170 between the substrate 100 and pixel electrodes 211, 221, and 231, a pixel defining layer 190, an intermediate layer 203 of a light-emitting diode 200, and an opposite electrode 205 may be arranged in the display area DA and the peripheral area PA. An encapsulation layer 300 covering the opposite electrode 205 may also be arranged in the display area DA and the peripheral area PA.

The first light shielding wall portion 410 and the second light shielding wall portion 430 may be arranged on the encapsulation layer 300 and may be simultaneously formed by the same process. The first light shielding wall portion 410 and the second light shielding wall portion 430 may include the same material. For example, the first light shielding wall portion 410 and the second light shielding wall portion 430 may each include a colored pigment or dye and/or a light shielding material. The light shielding material may include an opaque inorganic insulating material including at least one metal oxide selected from titanium oxide ($TiO_2$), chromium oxide ($Cr_2O_3$), or molybdenum oxide ($MoO_3$), or an opaque organic insulating material such as black resin.

The first light shielding wall portion 410 and the second light shielding wall portion 430 may have substantially the same thickness t, and the thickness t may be in a range of about 8 μm to about 20 μm. In this manner, height differences between the display area DA and the peripheral area PA may be significantly reduced.

The first light shielding wall portion 410 and the second light shielding wall portion 430 may each include a first surface S1 facing the substrate 100 and a second surface S2 opposite to the first surface S1. The second surface S2 may be hydrophobic. In an embodiment, the second surface S2 may become hydrophobic by a photolithography process of forming the first light shielding wall portion 410 and the second light shielding wall portion 430. In another embodiment, after the first light shielding wall portion 410 and the second light shielding wall portion 430 are formed, a surface treatment may be performed on the second surface S2, such that the second surface S2 becomes hydrophobic.

The first color conversion layer 451, the second color conversion layer 452, or the light transmission layer 453 may be formed in the first opening portion OP1 of the first light shielding wall portion 410 through an inkjet printing process. Because an ink material forming the first color conversion layer 451, the second color conversion layer 452, or the light transmission layer 453 is hydrophilic and the second surface S2 of the first light shielding wall portion 410 is hydrophobic, the ink material may be prevented from flowing from the predetermined first opening portion OP1 to another adjacent first opening portion OP1 over the first light shielding wall portion 410. Therefore, it is possible to prevent mixing of the first color conversion layer 451, the second color conversion layer 452, and the light transmission layer 453 and to improve the manufacturing quality of the display apparatus.

The first capping layer 470 may be arranged over the display area DA and the peripheral area PA and may cover or overlap the first light shielding wall portion 410 and the second light shielding wall portion 430. The first capping layer 470 may be in contact with the encapsulation layer 300 in a separation area SA between the first light shielding wall portion 410 and the second light shielding wall portion 430.

For example, as illustrated in FIG. 6, the light shielding layer 510 and the first to third color filter layers 531, 532, and 533 may be arranged in the display area DA. As another example, the light shielding layer 510 and the first to third color filter layers 531, 532, and 533 may be arranged in the peripheral area PA.

A filler 540 may be located in the separation area SA. Height differences in upper surfaces between the separation area SA and the display area DA and between the separation area SA and the peripheral area PA may be removed, a flat upper surface being formed. The filler 540 may include an organic material such as an acrylic resin, an epoxy resin, polyimide, or polyethylene.

A second capping layer 550 may be arranged on the filler 540, and the second capping layer 550 may be arranged over the display area DA and the peripheral area PA.

In order to form a light shielding wall portion including opening portions, a photolithography process of forming a layer including a certain pattern may be performed. A material of the light shielding wall portion may be deposited on, for example, the entire encapsulation layer. A photoresist may be applied on the deposited material of the light shielding wall portion by various methods such as spin-coating, spraying, or immersion. The photoresist may be a negative photoresist. An exposure mask on which a certain pattern is formed may be arranged on the photoresist, and the pattern may correspond to the light shielding wall portion. The certain pattern of the exposure mask on the photoresist may be exposed. A portion of the photoresist may be removed through a developing process. Because the photoresist is the negative photoresist as described above, a portion of the photoresist other than the exposed portion of the photoresist may be removed by a developing process to form a patterned photoresist. An etching process may be performed by using the patterned photoresist as an etching mask. The etching process may remove a portion of the material of the light shielding wall portion, and an opening portion may be formed in an area where the portion of the material of the light shielding wall portion is removed. The photoresist is removed to form a light shielding wall portion including opening portions.

Figure 7A:
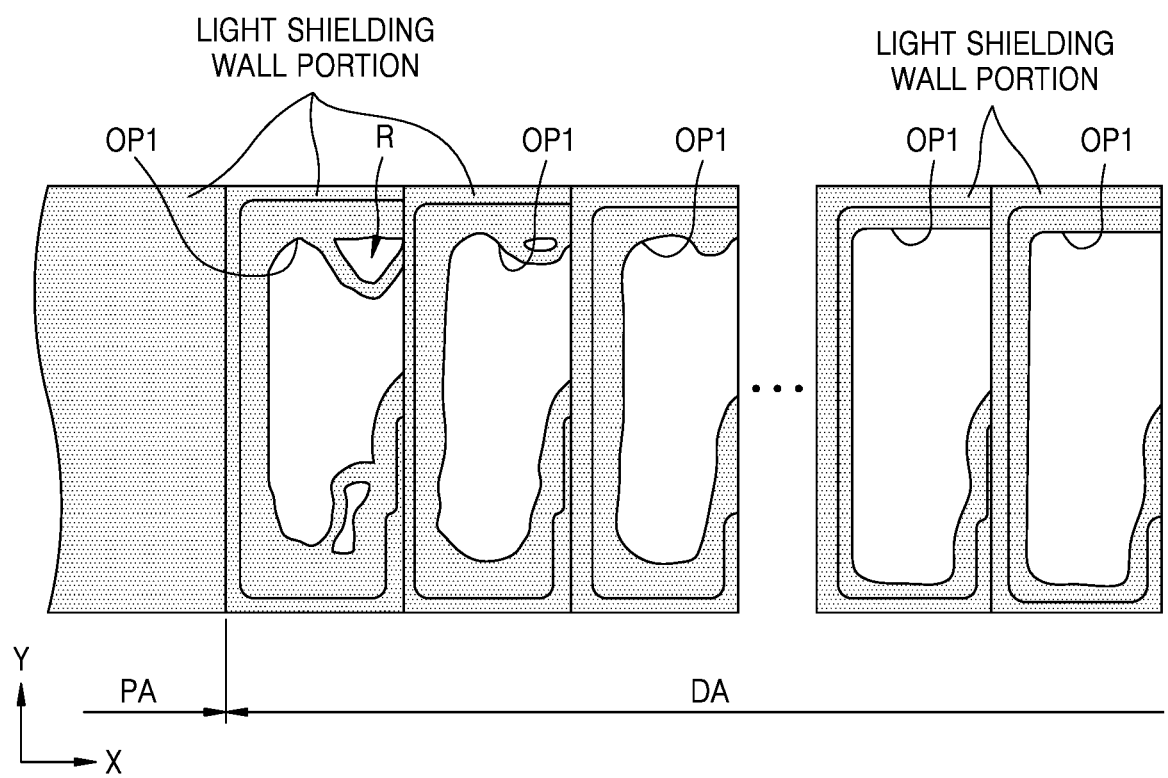
FIG. 7A is a schematic plan view illustrating a portion of a first light shielding wall portion of a display apparatus, according to a comparative example.
Figure 7B:
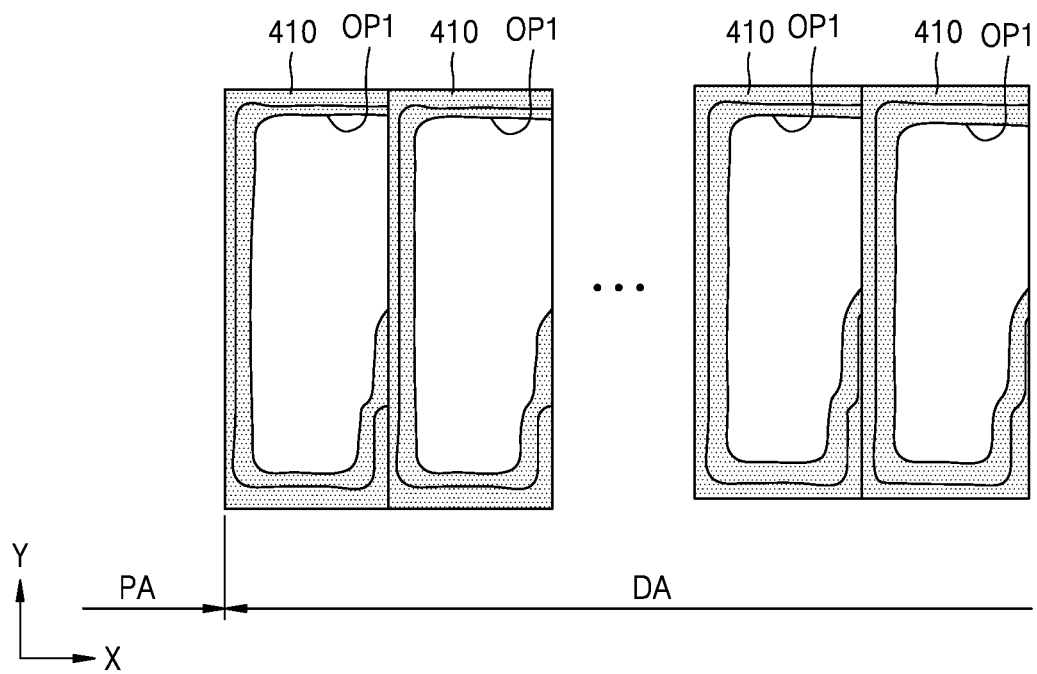
FIG. 7B is a schematic plan view illustrating a portion of a first light shielding wall portion of a display apparatus, according to an embodiment.

FIG. 7A is a plan view schematically illustrating a portion of a first light shielding wall portion of a display apparatus, according to a comparative example, and FIG. 7B is a plan view schematically illustrating a portion of a first light shielding wall portion of a display apparatus, according to an embodiment.

Referring to FIG. 7A, as a comparative example, the display apparatus includes a light shielding wall portion including a first opening portion OP1 arranged in a display area DA, and the light shielding wall portion may extend up to the peripheral area PA. An opening portion may not be formed in the peripheral area PA.

An exposure mask for forming the light shielding wall portion may include a penetration portion corresponding to the peripheral area PA. In an exposure process, light may pass through the penetration portion and may reach the photoresist on the peripheral area PA, and a light shielding wall portion may be formed over the entire peripheral area PA. However, in the exposure process, light may be diffracted or scattered while passing through the penetrating portion and may unintentionally reach a portion of the display area DA adjacent to the peripheral area PA, for example, a portion of the photoresist located on the edge of the display area DA. The unintentional exposure may unintentionally deform the pattern of photoresist. As a result, uneven first opening portions OP1 may be formed in the edge of the display area DA.

The formation of the uneven first opening portions OP1 may cause the uneven formation of the first color conversion layer 451, the second color conversion layer 452, and the light transmission layer 453, which are located in the first opening portions OP1.

Also, when compared with the width or area of the penetration portion of the exposure mask corresponding to the first opening portion OP1, the width or area of the first opening portion OP1 that is actually formed may be changed, and thus, the deviation may be increased. The width of the first opening portion OP1 in a plane placed between the first surface and the second surface of the light shielding wall portion may be smaller than the width of the first opening portion OP1 in a plane placed on the first surface of the light shielding wall portion (e.g., the bottom surface of the light shielding wall portion). Therefore, a tail may be formed on the inner surface of the first opening portion OP1.

Because of the deviation and the tail, the amount of the first color conversion layer 451, the second color conversion layer 452, and the light transmission layer 453 formed in the first opening portion OP1 may be unintentionally changed.

As a result, the deviation may occur in height, width, or area of the first color conversion layer 451, the second color conversion layer 452, and the light transmission layer 453 according to the position of the display area DA, which adversely affects uniformity in color coordinates or light conversion efficiency of the display apparatus 1. This may cause deterioration of image quality uniformity.

Also, due to the unintentional exposure, one first opening portion OP1 may not be formed in the edge of the display area DA, and an unintentional opening portion R may be partially formed. In case that the opening portion R is filled with the color conversion layer or the light conversion layer, a residual film phenomenon or stain defect may be caused.

However, according to an embodiment, the display apparatus 1 may include a separation area SA (see, e.g., FIG. 5) between the first light shielding wall portion 410 and the second light shielding wall portion 430. The separation area SA may be an area that overlaps the peripheral area PA and is arranged adjacent to the edge of the display area DA. The exposure mask used to form the light shielding wall portion may be formed such that light does not pass through a portion of the exposure mask corresponding to the separation area SA. In other words, the penetration portion may not be formed in the portion of the exposure mask corresponding to the separation area SA. As a result, in the exposure process, unintended light may be prevented (or may be reduced) from reaching the portion of the photoresist located in the portion of the display area DA adjacent to the peripheral area PA by diffraction or scattering of light.

Referring to FIG. 7B, in a display apparatus 1 according to an embodiment, a first opening portion OP1 having a desired shape may be formed in a portion of a first light shielding wall portion 410 adjacent to the peripheral area PA. First opening portions OP1 do not change according to the position of the display area DA and may be formed uniformly. The uniform formation of the first opening portions OP1 leads to the uniform formation of a first color conversion layer 451, a second color conversion layer 452, and a light transmission layer 453. Therefore, image quality uniformity and display quality may be improved.

In an embodiment, because a portion of a photoresist corresponding to a separation area SA is not exposed, the portion of the photoresist may be removed by a developing process. In the developing process, a developer may be dispersed into a portion of the photoresist corresponding to the separation area SA and a portion corresponding to the first opening portion OP1 arranged in the edge of the display area DA. This may allow the first opening portion OP1 arranged in the edge of the display area DA to be better formed.

Figure 8A:
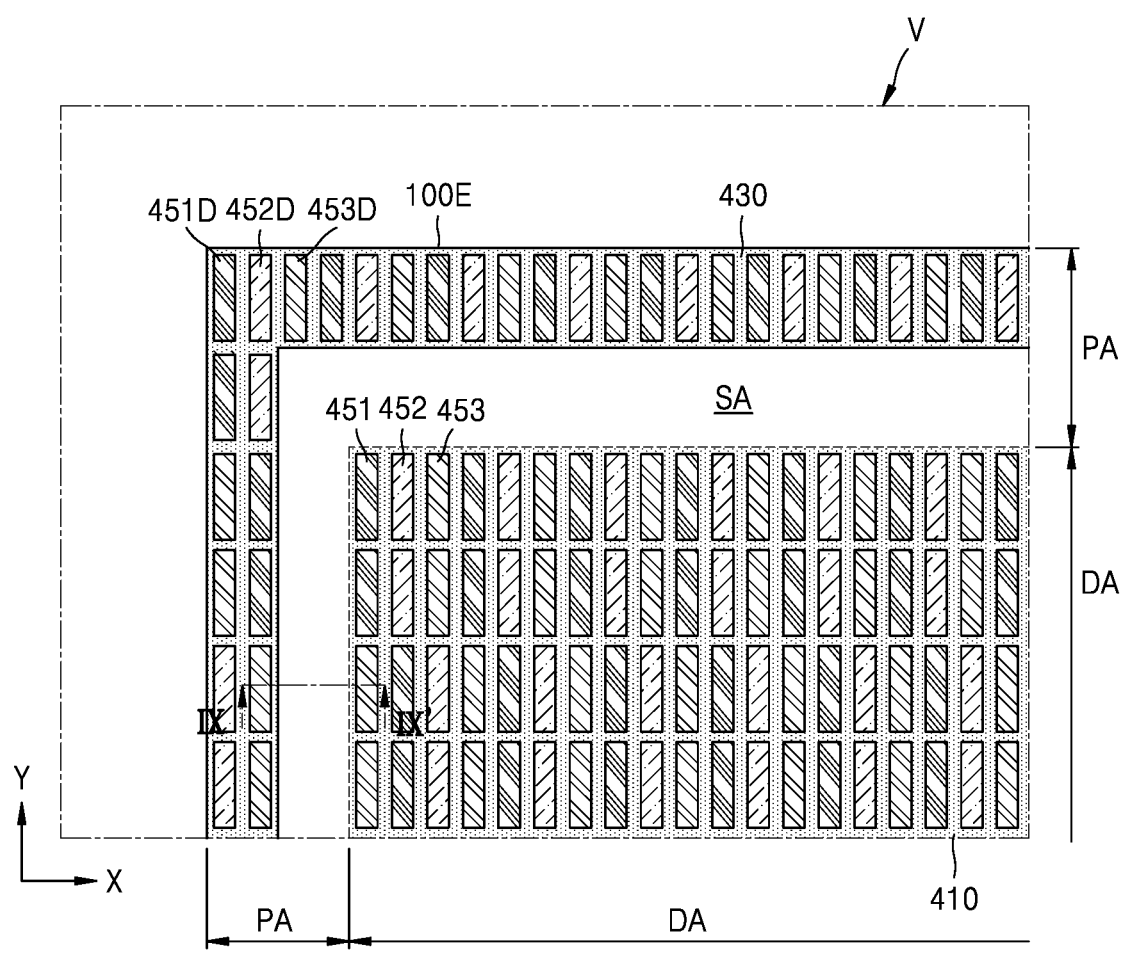
FIGS. 8A and 8B are enlarged plan views schematically illustrating a portion of a display apparatus, according to other embodiments.
Figure 8B:
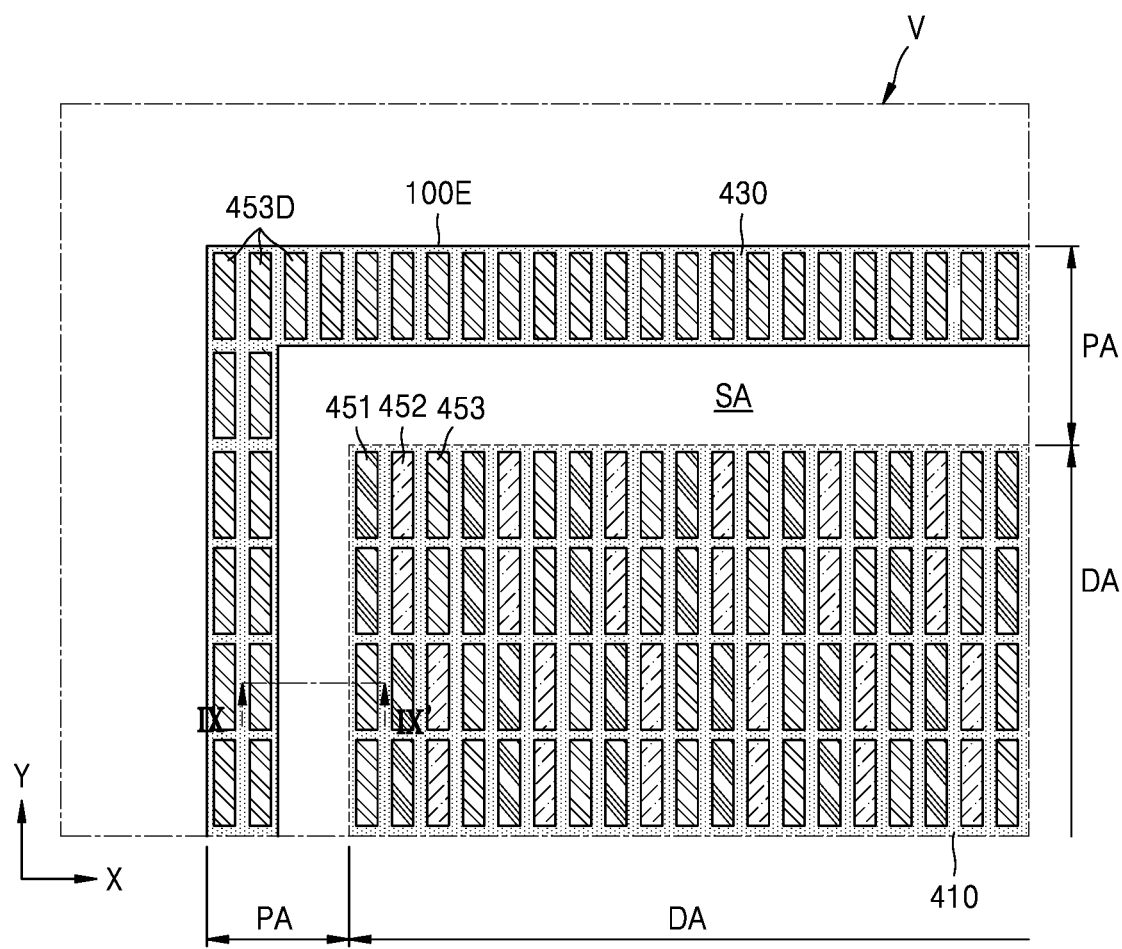

FIGS. 8A and 8B are enlarged plan views schematically illustrating a portion of a display apparatus, according to other embodiments. A description of the same elements as those described above with reference to FIG. 5 will be omitted, and differences will be mainly described below.

Referring to FIG. 8A, a second light shielding wall portion 430 may include second opening portions OP2. The second opening portions OP2 and the first opening portions OP1 may have the same shape and may be arranged in the same manner. In another embodiment, the second opening portions OP2 and the first opening portions OP1 may have different shapes and/or arrangements.

In an embodiment, a first dummy color conversion layer 451D, a second dummy color conversion layer 452D, and a dummy light transmission layer 453D may be located in the second opening portions OP2, respectively. The first dummy color conversion layer 451D and the first color conversion layer 451 may include the same material, the first dummy color conversion layer 451D and the first color conversion layer 451 may include the same material, the second dummy color conversion layer 452D and the second color conversion layer 452 may include the same material, and the dummy light transmission layer 453D and the light transmission layer 453 may include the same material.

As will be described below with reference to FIG. 9, because in the peripheral area PA, a light-emitting diode is not arranged or, if arranged, is not driven, light emitted from a light-emitting unit 10 may not pass through the first dummy color conversion layer 451D, the second dummy color conversion layer 452D, and the dummy light transmission layer 453D. The first dummy color conversion layer 451D, the second dummy color conversion layer 452D, and the dummy light transmission layer 453D may not function to substantially convert or transmit light.

Referring to FIG. 8B, one of the first dummy color conversion layer 451D, the second dummy color conversion layer 452D, and the dummy light transmission layer 453D may be located in the second opening portions OP2. For example, the dummy light transmission layer 453D may be located in the second opening portions OP2.

As such, because the layers formed in the second opening portions OP2 are layers of a single type (e.g., the dummy light transmission layers 453D), the processing can be readily performed. In particular, in case that only the dummy light transmission layer 453D is formed in the second openings OP2, the dummy light transmission layer 453D may not include quantum dots, unlike the first dummy color conversion layer 451D and the second dummy color conversion layer 452D. Therefore, manufacturing costs may be reduced.

Figure 9:
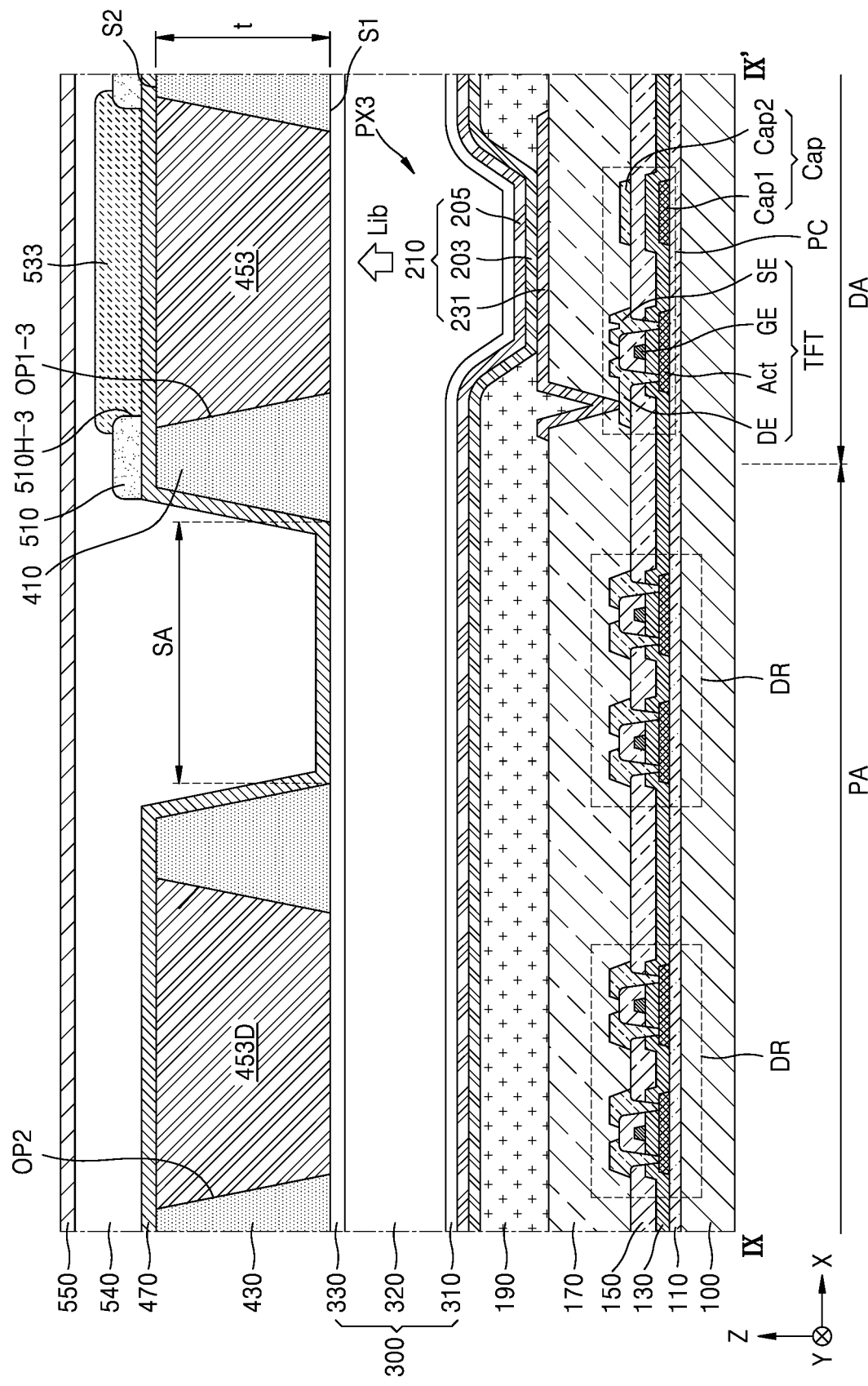
FIG. 9 is a cross-sectional view schematically illustrating a portion of the display apparatus of FIG. 8A or 8B.

FIG. 9 is a cross-sectional view schematically illustrating a portion of the display apparatus of FIG. 8A or 8B and may correspond to a cross-section taken along line IX-IX' of FIG. 8A or 8B.

FIG. 9 illustrates a 1-3-th opening portion OP1-3 among first opening portions OP1 and a light transmission layer 453 located in the 1-3-th opening portion OP1-3, and illustrates a second opening portion OP2 among second opening portions OP2 and a dummy light transmission layer 453D located in the second opening portion OP2. However, because this is only an example taken along line VI-VI' of FIG. 8A or 8B, the disclosure is not limited thereto.

The light transmission layer 453 and the dummy light transmission layer 453D may be arranged on the same layer, for example, an encapsulation layer 300.

A light-emitting diode 200 may not be arranged in the peripheral area PA. Even in case that the light-emitting diode 200 is arranged in the peripheral area PA, the light-emitting diode 200 may not be electrically connected to the pixel circuit PC or may not be driven. Because no light is emitted in the peripheral area PA, the dummy light transmission layer 453D may not function to substantially transmit light. However, because the spaces in the second opening portions OP2 are filled, height differences may be eliminated and the second opening portions OP2 may serve as spacers.

According to the embodiments described above with reference to FIGS. 8A, 8B, and 9, similarly to those described with reference to FIG. 7B, a display apparatus 1 having improved image quality uniformity and improved display quality may be provided.

Figure 10A:
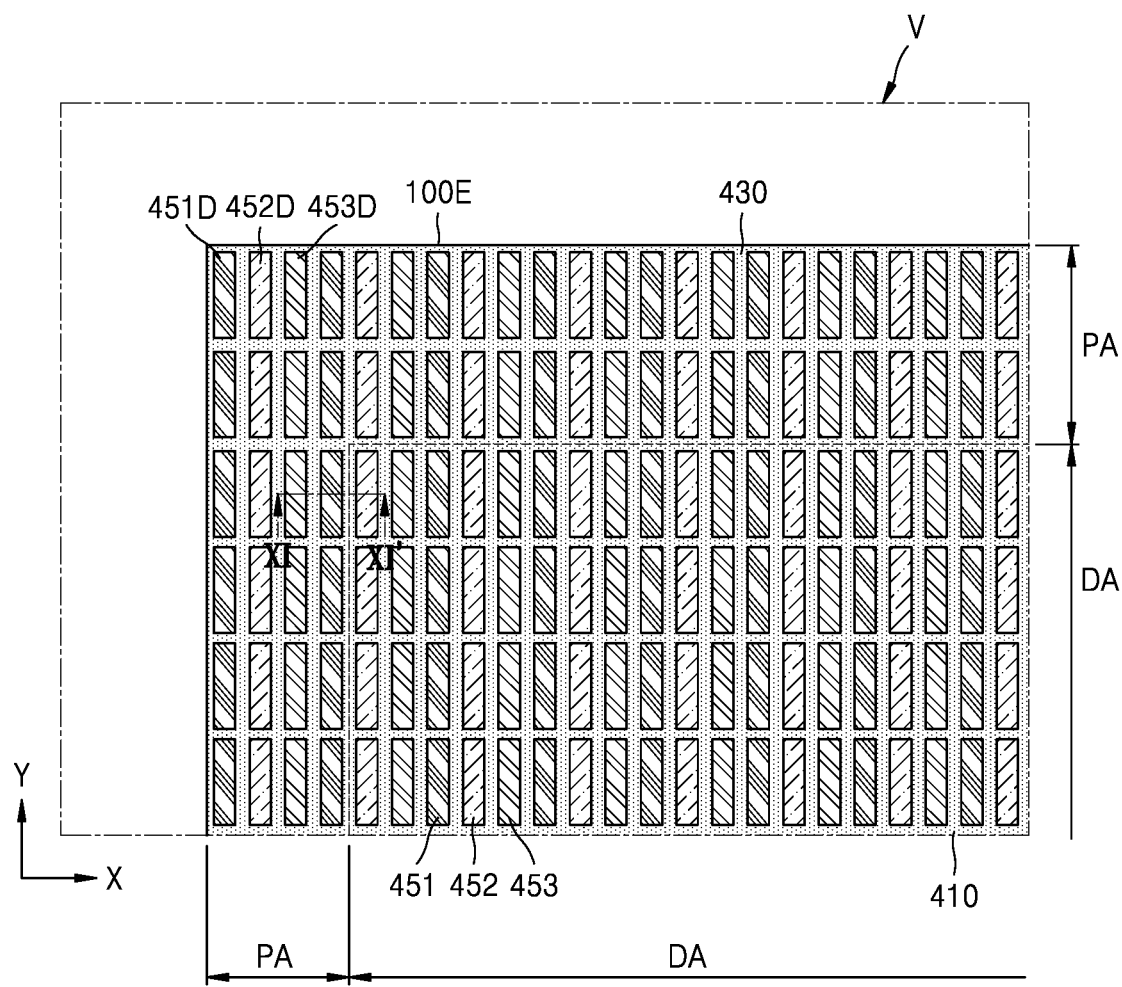
FIGS. 10A and 10B are enlarged plan views schematically illustrating a portion of a display apparatus, according to other embodiments.
Figure 10B:
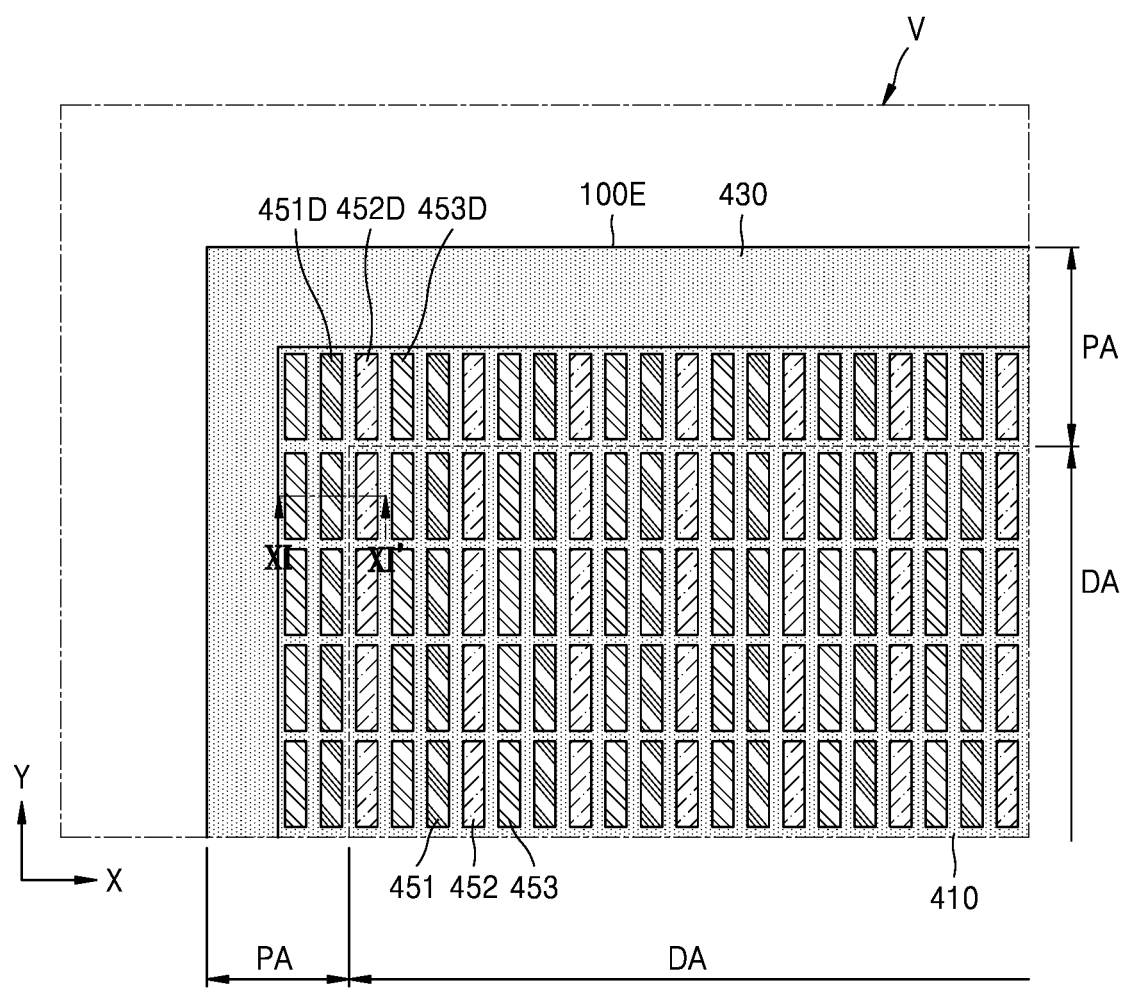

FIGS. 10A and 10B are enlarged plan views schematically illustrating a portion of a display apparatus, according to other embodiments.

Referring to FIG. 10A, a first light shielding wall portion 410 and a second light shielding wall portion 430 may be connected to each other to be integral with each other. The first light shielding wall portion 410 may include first opening portions OP1, and the second light shielding wall portion 430 may include second opening portions OP2. The first opening portions OP1 and the second opening portions OP2 may be formed to have the same shape and the same type of arrangement. The second opening portions OP2 may be formed in the second light shielding wall portion 430 over the entire peripheral area PA.

A first color conversion layer 451, a second color conversion layer 452, and a light transmission layer 453 may be located in the first opening portions OP1, and a first dummy color conversion layer 451D, a second dummy color conversion layer 452D, and a dummy light transmission layer 453D may be located in the second opening portions OP2. As described above with reference to FIG. 8B, one of the first dummy color conversion layer 451D, the second dummy color conversion layer 452D, and the dummy light transmission layer 453D may be located in the second opening portions OP2. For example, the dummy light transmission layer 453D may be located in the second opening portions OP2.

Referring to FIG. 10B, the second light shielding wall portion 430 includes second opening portion OP2, and the second opening portions OP2 may be arranged in a portion of the peripheral area PA adjacent to the display area DA.

Figure 11:
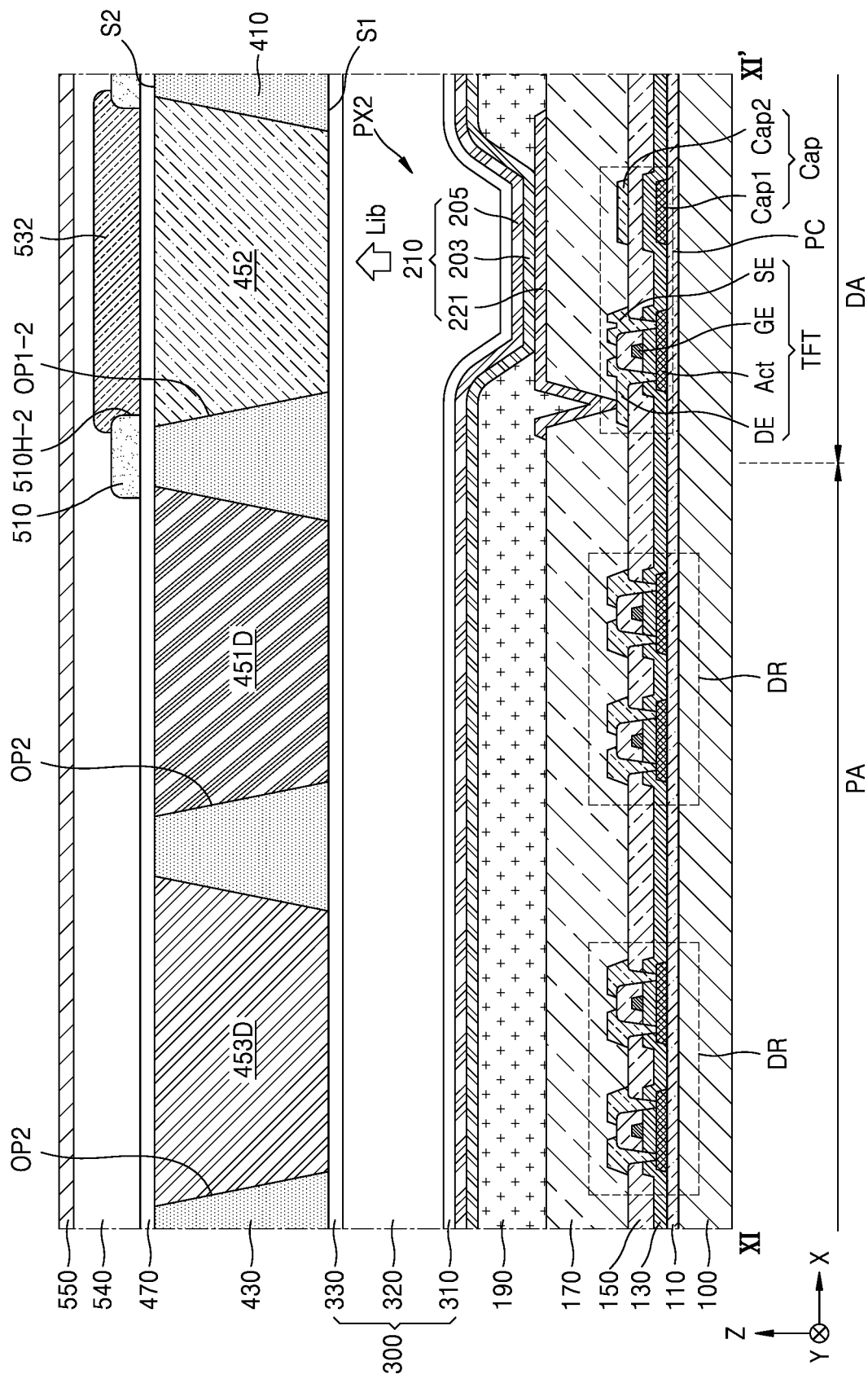
FIG. 11 is a cross-sectional view schematically illustrating a portion of the display apparatus of FIG. 10A or 10B.

FIG. 11 is a cross-sectional view schematically illustrating a portion of the display apparatus of FIG. 10A or 10B and may correspond to a cross-section taken along line XI-XI' of FIG. 10A or 10B.

FIG. 11 illustrates a 1-2-th opening portion OP1-2 among first opening portions OP1 and a second color conversion layer 452 located in the 1-2-th opening portion OP1-2, two second opening portions OP2 among second opening portions OP2, and a dummy light transmission layer 453D and a first dummy color conversion layer 451D respectively located in the two second opening portions OP2. However, because this is only an example taken along line XI-XI' of FIG. 10A or 10B, the disclosure is not limited thereto.

The second color conversion layer 452, the dummy light transmission layer 453D, and the first dummy color conversion layer 451D may be arranged on the same layer, for example, an encapsulation layer 300.

The dummy light transmission layer 453D and the first dummy color conversion layer 451D may not function to substantially transmit light. However, because the spaces in the second opening portions OP2 are filled, height differences may be eliminated and the second opening portions OP2 may serve as spacers.

According to the embodiments described above with reference to FIGS. 10A, 10B, and 11, the second opening portions OP2 may be arranged in at least a portion of the peripheral area PA adjacent to the display area DA. In order to form the second opening portions OP2, an exposure mask may be formed such that light does not pass through a portion of the exposure mask corresponding to the second opening portions OP2. In other words, a penetration portion may not be formed in the portion of the exposure mask corresponding to the second opening portions OP2 (for example, a portion of the exposure mask corresponding to a portion of the peripheral area adjacent to the display area). In this manner, in the exposure process, it is possible to significantly reduce undesired light reaching a portion of a photoresist corresponding to the edge of the display area DA by diffraction or scattering of light.

Therefore, the first opening portions OP1 having a good shape may be formed even in the edge of the display area DA adjacent to the peripheral area PA. The first opening portions OP1 do not change according to the position of the display area DA and may be formed uniformly. The uniform formation of the first opening portions OP1 leads to the uniform formation of a first color conversion layer 451, a second color conversion layer 452, and a light transmission layer 453. Therefore, image quality uniformity and display quality may be improved.

Although the display apparatuses have been described, the disclosure is not limited thereto. For example, it may be understood that methods of manufacturing the display apparatuses also fall within the scope of the disclosure.

According to one or more embodiments, the color conversion layer and the light transmission layer arranged in the display area are uniformly formed to improve image quality uniformity. Therefore, the display apparatus having improved display quality may be implemented. The scope of the disclosure is not limited by these effects.

It should be understood that embodiments described herein should be considered in a descriptive sense only and not for purposes of limitation. Descriptions of features or aspects within each embodiment should generally be considered available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate comprising a first area, and a second area adjacent to the first area;
   a first light-emitting diode, a second light-emitting diode, and a third light-emitting diode that are arranged in the first area of the substrate and include a color emission layer;
   an encapsulation layer overlapping the first light-emitting diode, the second light-emitting diode, and the third light-emitting diode, and comprising at least one inorganic layer and at least one organic layer;
   a first light shielding wall portion disposed on the encapsulation layer and not overlapping the first light-emitting diode, the second light-emitting diode, and the third light-emitting diode, the first light shielding wall portion comprising a 1-1-th opening portion, a 1-2-th opening portion, and a 1-3-th opening portion corresponding to the first light-emitting diode, the second light-emitting diode, and the third light-emitting diode, respectively; and
   a second light shielding wall portion disposed on the encapsulation layer and overlapping the second area of the substrate; and
   a driver arranged in the second area of the substrate and providing electrical signals to the first, second, and third light-emitting diodes, wherein
   the first light shielding wall portion and the second light shielding wall portion are spaced apart from each other in a plan views,
   at least a portion of the second light shielding wall portion overlaps the driver in a plan view.

2. The display apparatus of claim 1, wherein the second light shielding wall portion is arranged along an edge of the substrate.

3. The display apparatus of claim 1, further comprising:
   a first color conversion layer located in the 1-1-th opening portion;
   a second color conversion layer located in the 1-2-th opening portion; and
   a light transmission layer located in the 1-3-th opening portion.

4. The display apparatus of claim 3, wherein
   the first color conversion layer, the second color conversion layer, and the light transmission layer each comprise scattering particles,
   the first color conversion layer and the second color conversion layer comprise a first quantum dot and a second quantum dot, respectively, and
   the first quantum dot and the second quantum dot comprise a same material and have different sizes from each other.

5. The display apparatus of claim 3, wherein the second light shielding wall portion comprises a plurality of second opening portions.

6. The display apparatus of claim 5, further comprising a first dummy color conversion layer, a second dummy color conversion layer, and a dummy light transmission layer,
   wherein each of the first dummy color conversion layer, the second dummy color conversion layer, and the dummy light transmission layer is located in corresponding one of the plurality of second opening portions.

7. The display apparatus of claim 5, further comprising a dummy light transmission layer located in the plurality of second opening portions.

8. The display apparatus of claim 6, wherein the dummy light transmission layer and the light transmission layer comprise a same material.

9. The display apparatus of claim 1, wherein the first light shielding wall portion and the second light shielding wall portion comprise a same material.

10. The display apparatus of claim 9, wherein the first light shielding wall portion and the second light shielding wall portion each comprise a colored pigment or dye, and/or at least one metal oxide selected from titanium oxide, chromium oxide, and molybdenum oxide.

11. The display apparatus of claim 1, wherein the first light shielding wall portion and the second light shielding wall portion each have a thickness of about 8 μm to about 20 μm.

12. The display apparatus of claim 1, wherein
the first light shielding wall portion and the second light shielding wall portion each comprise a first surface facing the substrate and a second surface opposite to the first surface, and
the second surface is hydrophobic.

13. The display apparatus of claim 1, wherein the second area is a peripheral area completely surrounding the display area.

14. The display apparatus of claim 1, wherein the second light shielding wall portion is spaced apart from each of the first light-emitting diode, the second light-emitting diode, and the third light-emitting diode.

15. A display apparatus comprising:
a substrate comprising a first area, and a second area adjacent to the first area;
a first light-emitting diode, a second light-emitting diode, and a third light-emitting diode that are arranged in the first area of the substrate and include a color emission layer;
an encapsulation layer overlapping the first light-emitting diode, the second light-emitting diode, and the third light-emitting diode, and comprising at least one inorganic layer and at least one organic layer;
a first light shielding wall portion disposed on the encapsulation layer and not overlapping the first light-emitting diode, the second light-emitting diode, and the third light-emitting diode, the first light shielding wall portion comprising a 1-1-th opening portion, a 1-2-th opening portion, and a 1-3-th opening portion corresponding to the first light-emitting diode, the second light-emitting diode, and the third light-emitting diode, respectively;
a second light shielding wall portion disposed on the encapsulation layer and overlapping the second area of the substrate; and
a driver arranged in the second area of the substrate and providing electrical signals to the first, second, and third light-emitting diodes, wherein
the first light shielding wall portion and the second light shielding wall portion are integral with each other,
the second light shielding wall portion comprises a plurality of second opening portions, and
at least a portion of the second light shielding wall portion overlaps the driver in a plan view.

16. The display apparatus of claim 15, further comprising:
a first color conversion layer located in the 1-1-th opening portion;
a second color conversion layer located in the 1-2-th opening portion;
a light transmission layer located in the 1-3-th opening portion;
a first dummy color conversion layer;
a second dummy color conversion layer; and
a dummy light transmission layer,
wherein each of the first dummy color conversion layer, the second dummy color conversion layer, and the dummy light transmission layer is located in corresponding one of the plurality of second opening portions.

17. The display apparatus of claim 16, wherein the dummy light transmission layer and the light transmission layer comprise a same material.

18. The display apparatus of claim 15, further comprising:
a first color conversion layer located in the 1-1-th opening portion;
a second color conversion layer located in the 1-2-th opening portion;
a light transmission layer located in the 1-3-th opening portion; and
a dummy light transmission layer located in the plurality of second opening portions.

19. A display apparatus comprising:
a light-emitting unit comprising a display area from which light of a single color is emitted, and a peripheral area adjacent to the display area; and
an optical unit that converts or transmits light emitted from the light-emitting unit into lights of different colors, wherein
the light-emitting unit comprises:
pixel electrodes arranged in the display area;
an opposite electrode disposed above the pixel electrodes; and
an emission layer disposed between the pixel electrodes and the opposite electrode, and
the optical unit comprises:
a first light shielding wall portion arranged in the display area, the first light shielding wall portion comprising a plurality of first opening portions corresponding to the pixel electrodes;
a second light shielding wall portion arranged in the peripheral area and spaced apart from the first light shielding wall portion in a plan view;
a first color conversion layer, a second color conversion layer, and a light transmission layer, each of the first color conversion layer, the second color conversion layer, and the light transmission layer being located in corresponding one of the plurality of first opening portions;
a capping layer overlapping the first light shielding wall portion; and
a first color filter layer, a second color filter layer, and a third color filter layer that are disposed on the capping layer and overlap the first color conversion layer, the second color conversion layer, and the light transmission layer, respectively.

20. The display apparatus of claim 19, wherein
the second light shielding wall portion comprises a plurality of second opening portions spaced apart from each other, and
the display apparatus further comprises a first dummy color conversion layer, a second dummy color conversion layer, and a dummy light transmission layer, each of the first dummy color conversion layer, the second dummy color conversion layer, and the dummy light transmission layer is located in corresponding one of the plurality of second opening portions.

21. The display apparatus of claim 19, wherein the first light shielding wall portion and the second light shielding wall portion are integral with each other and comprise a same material.

* * * * *